(12) United States Patent
Mlcak et al.

(10) Patent No.: US 10,955,318 B2
(45) Date of Patent: *Mar. 23, 2021

(54) AIRCRAFT AIR CONTAMINANT ANALYZER AND METHOD OF USE

(71) Applicant: Pall Corporation, Port Washington, NY (US)

(72) Inventors: Richard Mlcak, Bolton, MA (US); Aidan Kodas, Waltham, MA (US); Patrick Gwynne, Stow, MA (US); Justin Abramson, Brookline, MA (US)

(73) Assignee: Pall Corporation, Port Washington, NY (US)

( * ) Notice: Subject to any disclaimer, the term of this patent is extended or adjusted under 35 U.S.C. 154(b) by 188 days.

This patent is subject to a terminal disclaimer.

(21) Appl. No.: 16/392,163

(22) Filed: Apr. 23, 2019

(65) Prior Publication Data

US 2020/0340889 A1 Oct. 29, 2020

(51) Int. Cl.
*G01N 1/22* (2006.01)
*B64D 13/00* (2006.01)
(Continued)

(52) U.S. Cl.
CPC .......... *G01N 1/2214* (2013.01); *B64D 13/00* (2013.01); *B81B 1/004* (2013.01); *B81B 7/0087* (2013.01);
(Continued)

(58) Field of Classification Search
CPC .. G01N 1/2214; G01N 1/4022; G01N 29/022; G01N 29/036; G01N 2291/014;
(Continued)

(56) References Cited

U.S. PATENT DOCUMENTS

| 5,356,594 A | 10/1994 | Neel et al. |
| 6,128,561 A | 10/2000 | Janata |

(Continued)

FOREIGN PATENT DOCUMENTS

| EP | 20164117 A2 | 5/2013 |
| GB | 2506991 A | 4/2014 |

(Continued)

OTHER PUBLICATIONS

European Patent Office, Extended European Search Report in European Patent Application No. 20164520.7, dated Sep. 25, 2020.
(Continued)

*Primary Examiner* — Benjamin R Schmitt
(74) *Attorney, Agent, or Firm* — Leydig Voit & Mayer

(57) ABSTRACT

Disclosed are methods for determining and classifying aircraft air contaminants using contaminant analyzers comprising a contaminant collector comprising a membrane and a heater vaporizing captured contaminants; a gravimetric sensor generating a proportionate response when contaminant mass is added to or removed from the sensor, the sensor arranged to receive contaminants desorbed from the membrane when the membrane is heated; a frequency measurement device, measuring the response generated by the sensor as the contaminant is added to and removed from the sensor; a computer readable medium bearing a contaminant recognition program and calibration data; a processor executing the recognition program, the program including a module classifying contaminants by type, and a module using the calibration data for comparison with magnitude of the response generated by the sensor to calculate contaminant concentration; and, a pump, generating flow of aircraft air through the contaminant collector before and after the membrane is heated.

22 Claims, 16 Drawing Sheets

(51) Int. Cl.
<table>
<tr><td>B81B 1/00</td><td>(2006.01)</td></tr>
<tr><td>B81B 7/00</td><td>(2006.01)</td></tr>
<tr><td>B81B 7/02</td><td>(2006.01)</td></tr>
<tr><td>G01N 1/40</td><td>(2006.01)</td></tr>
<tr><td>G01N 29/02</td><td>(2006.01)</td></tr>
<tr><td>G01N 29/036</td><td>(2006.01)</td></tr>
</table>

(52) U.S. Cl.
CPC ............ *B81B 7/02* (2013.01); *G01N 1/4022* (2013.01); *G01N 29/022* (2013.01); *G01N 29/036* (2013.01); *B81B 2201/0214* (2013.01); *B81B 2201/0271* (2013.01); *G01N 2291/014* (2013.01); *G01N 2291/021* (2013.01); *G01N 2291/02809* (2013.01)

(58) Field of Classification Search
CPC ... G01N 2291/021; G01N 2291/02809; G01N 2291/0215; G01N 2291/0255; G01N 2291/0256; G01N 2291/0423; G01N 2291/0426; G01N 2291/0427; G01N 2015/0046; G01N 15/0637; G01N 5/02; G01N 1/2273; G01N 2001/2223; B81B 1/004; B81B 7/02; B81B 2201/0271; G01G 3/16; B64D 13/00
See application file for complete search history.

(56) References Cited

U.S. PATENT DOCUMENTS

| | | |
|---|---|---|
| 6,171,378 B1 | 1/2001 | Manginell et al. |
| 6,212,938 B1 | 4/2001 | Staples |
| 6,289,287 B1 | 9/2001 | Meng et al. |
| 6,354,160 B1 | 3/2002 | Staples et al. |
| 6,421,588 B1 | 7/2002 | Janata |
| 6,627,965 B1 | 9/2003 | Tuller et al. |
| 6,711,470 B1 | 3/2004 | Hartenstein et al. |
| 6,839,636 B1 | 1/2005 | Sunshine et al. |
| 6,953,977 B2 | 10/2005 | Mlcak et al. |
| 7,103,481 B2 | 9/2006 | Negri |
| 7,547,931 B2 | 6/2009 | Star et al. |
| 7,917,309 B2 | 3/2011 | Brodsky |
| 7,955,574 B2 | 6/2011 | Fryxell et al. |
| 8,221,828 B2 | 7/2012 | Chinn et al. |
| 8,366,630 B2 | 2/2013 | Haick et al. |
| 8,652,853 B2 | 2/2014 | Markowitz et al. |
| 9,296,839 B2 | 3/2016 | Venema et al. |
| 9,459,223 B1 | 10/2016 | Alqahtani et al. |
| 9,599,564 B1 | 3/2017 | Li |
| 2001/0014478 A1* | 8/2001 | Schaedlich ........ G01N 33/0045 436/81 |
| 2004/0060344 A1 | 4/2004 | Kauffman et al. |
| 2005/0016276 A1 | 1/2005 | Guan et al. |
| 2005/0160792 A1 | 7/2005 | Booker |
| 2007/0086921 A1 | 4/2007 | Visel et al. |
| 2009/0141769 A1 | 6/2009 | Baldwin et al. |
| 2010/0130796 A1 | 5/2010 | Combes et al. |
| 2013/0199271 A1 | 8/2013 | Beer et al. |
| 2016/0327518 A1 | 11/2016 | Matheron et al. |
| 2016/0364852 A1 | 12/2016 | Omodt et al. |
| 2017/0045399 A1 | 2/2017 | Lash et al. |
| 2017/0097255 A1 | 4/2017 | Karakaya |
| 2017/0115197 A1 | 4/2017 | Niemelä et al. |
| 2017/0342276 A1 | 11/2017 | Wang et al. |
| 2017/0363524 A1 | 12/2017 | Reed |
| 2018/0148180 A1 | 5/2018 | Fagundes et al. |
| 2020/0340890 A1 | 10/2020 | Mlcak |
| 2020/0340949 A1 | 10/2020 | Mlcak et al. |
| 2020/0340950 A1 | 10/2020 | Mlcak et al. |

FOREIGN PATENT DOCUMENTS

| | | |
|---|---|---|
| WO | WO 2004/005907 A1 | 1/2004 |
| WO | WO 2013/064157 A1 | 5/2013 |
| WO | WO 2016/189420 A1 | 12/2016 |
| WO | WO 2018/089674 A1 | 5/2018 |

OTHER PUBLICATIONS

Pall Corporation, "Gaskleen® Pico1000 Analyzer," Product Data Sheet (Aug. 2015).
Wikipedia, "Triethoxysilane," (Jul. 7 2015) accessed at <en.wikipedia.org/wiki/Triethoxysilane> on Jan. 11, 2019.
Bao Yuyang et al: "Resonant-gravimetric particle sensors with air-filtering cantilever fabricated in low-cost non-SOI silicon", 2018 *Micro Electro Mechanical Systems* (MEMS), IEEE, Jan. 21, 2018, pp. 908-911, XP033335731, COI: 10.1109/MEMSYS.2018.8346704.
European Patent Office, Extended European Search Report in counterpart European Patent Application No. 20164117.2, dated Sep. 23, 2020.
Voiculescu et al., "Micropreconcentrator for Enhanced Trace Detection of Explosives and Chemical Agents," *IEEE Sensors Journal*, 6(5): 1094-1104 (2006).

\* cited by examiner

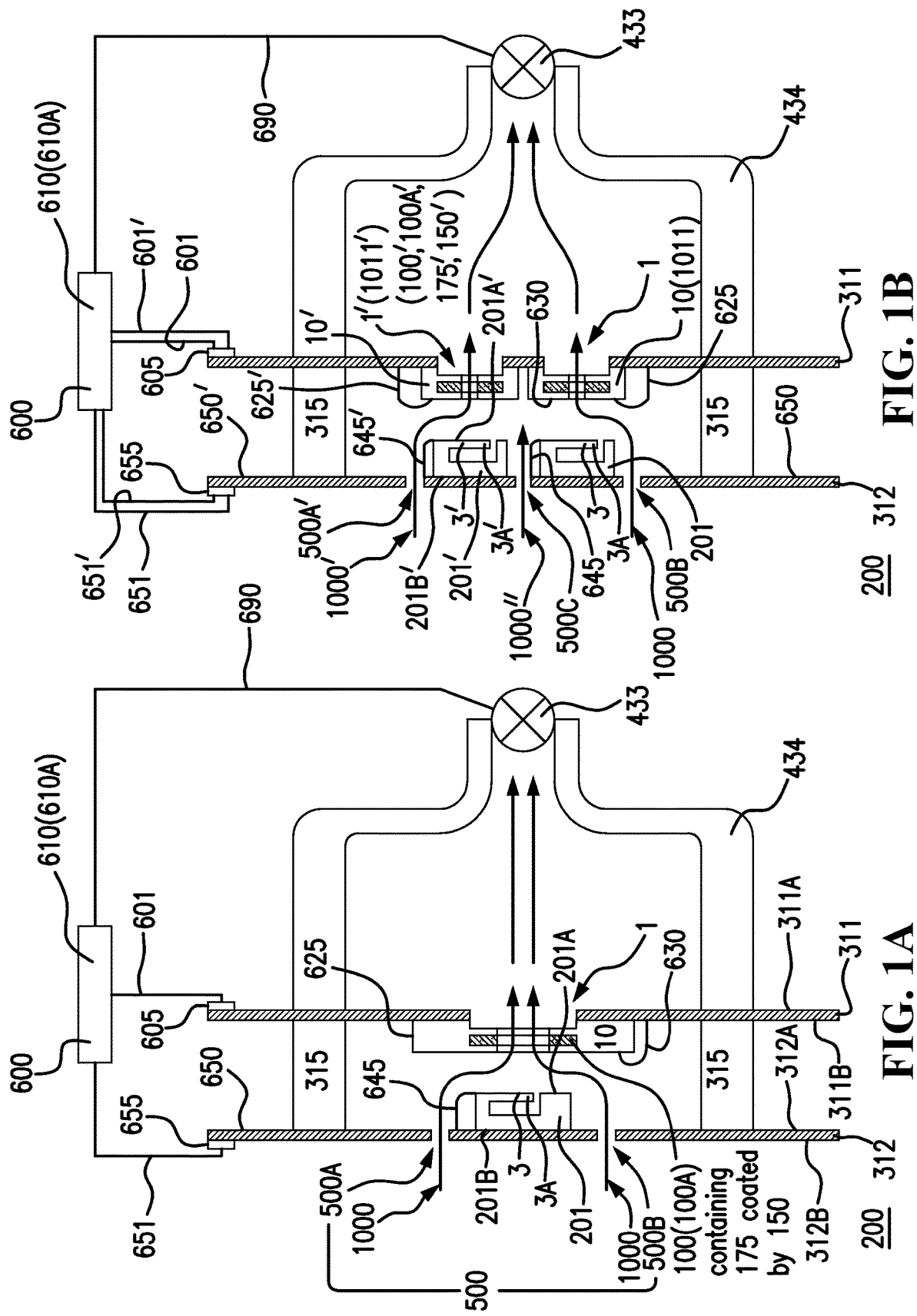

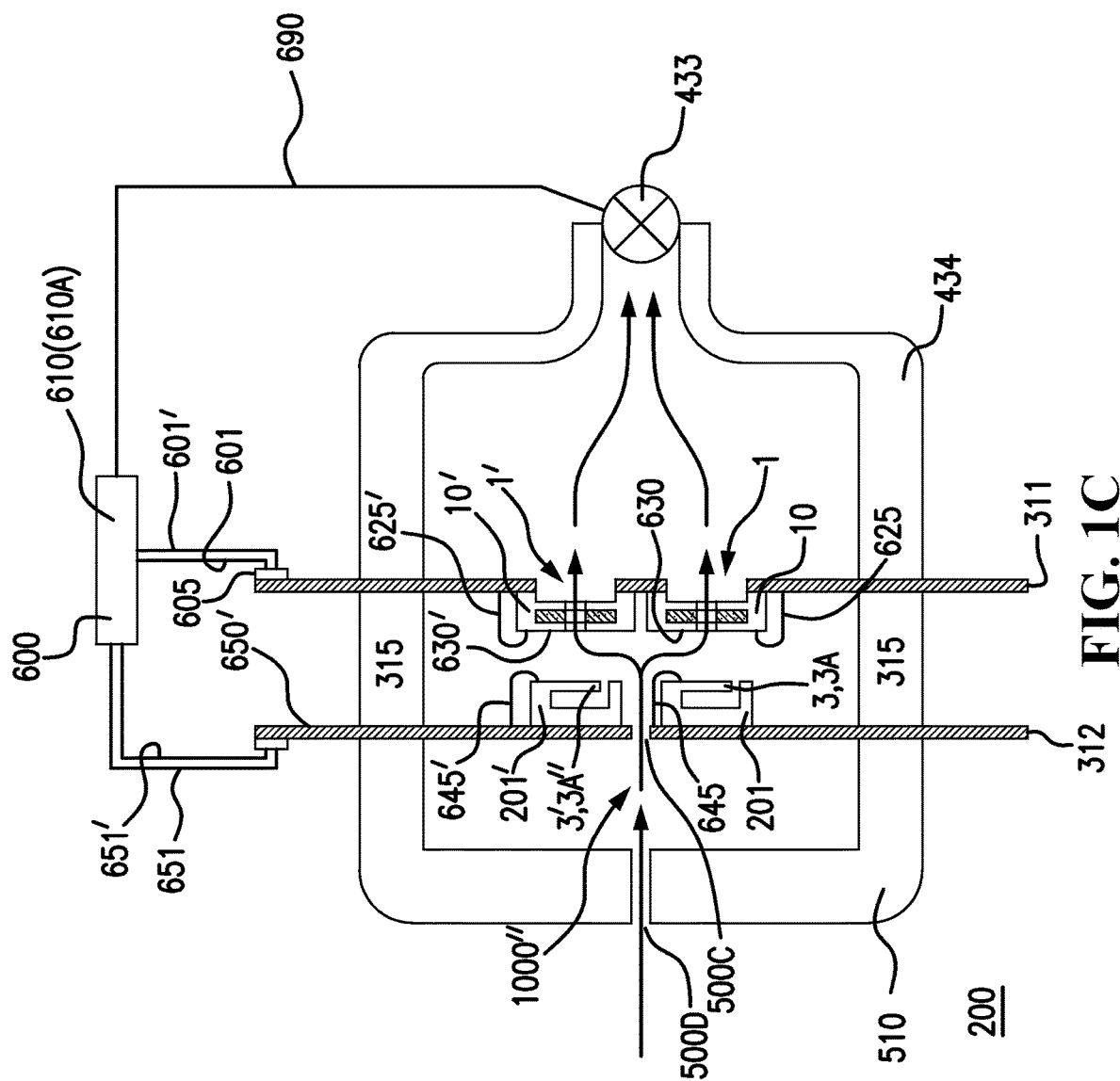

AIRCRAFT AIR CONTAMINANT ANALYZER AND METHOD OF USE

BACKGROUND OF THE INVENTION

Contaminants such as turbine engine oil and hydraulic fluid can be present in air or other gasses in the cabin/cockpit of an aircraft, during flight and/or during ground operation. Certain contaminants can be present in aerosol form, particulate form and/or gaseous form. Detecting and identifying the composition or type of contamination is often needed to protect health and/or equipment, detect faults, and help identify the source or cause of the contamination. Inability to detect and identify the contamination may cause the need for a flight diversion, flight cancellation, or emergency landing to ensure the safety of passengers and crew, which, at a minimum, is an inconvenience, and increases costs.

There is a need for improved methods for detection and detection systems. The present invention provides for ameliorating at least some of the disadvantages of the prior art. These and other advantages of the present invention will be apparent from the description as set forth below.

BRIEF SUMMARY OF THE INVENTION

An embodiment of the invention provides a method for determining and classifying by type aircraft air contaminants, the method comprising (a) passing aircraft air through an aircraft air contaminant analyzer comprising at least one aircraft air contaminant collector comprising: (i) a microporous medium comprising microporous flow-through channels, the microporous medium having a chemoselective coating; and (ii) a thin film resistive heater, capable of heating to a temperature that vaporizes captured air contaminants, wherein the heater is in contact with the microporous medium; (b) capturing air contaminants by the microporous medium; (c) discontinuing passing aircraft air through the at least one aircraft air contaminant collector; (d) heating the microporous medium to a temperature sufficient to vaporize the captured air contaminants and desorb the captured air contaminants; (e) receiving the desorbed air contaminants on a gravimetric sensor arranged to generate a proportionate resonant frequency response when air contaminant mass is added to or removed from the gravimetric sensor; (f) measuring the proportionate resonant frequency response generated by the gravimetric sensor as the air contaminant is added to and removed from the gravimetric sensor; (g) executing an air contaminant recognition program stored upon a computer-readable medium, including calculating air contaminant concentration and determining air contaminant type; and, (h) outputting the determined air contaminant concentration and air contaminant type.

In another embodiment of the invention, the method comprises (a) passing aircraft air through an aircraft air contaminant analyzer comprising two or more aircraft air contaminant collectors, each collector comprising: (i) a microporous medium comprising microporous flow-through channels, the microporous medium having a chemoselective coating; and (ii) a thin film resistive heater, capable of heating to a temperature that vaporizes captured air contaminants, wherein the heater is in contact with the microporous medium; (b) capturing air contaminants by each microporous medium; (c) discontinuing passing aircraft air through the two or more aircraft air contaminant collectors; (d) heating each microporous medium to a temperature sufficient to vaporize the captured air contaminants and desorb the captured air contaminants; (e) receiving the desorbed air contaminants of each of the two or more aircraft air contaminant collector onto each gravimetric sensor, each gravimetric sensor being arranged to generate a proportionate resonant frequency response when air contaminant mass is added to or removed from the gravimetric sensor; (f) measuring the proportionate resonant frequency response generated by each gravimetric sensor as the air contaminant is added to and removed from each gravimetric sensor; (g) executing an air contaminant recognition program stored upon a computer-readable medium, including calculating air contaminant concentrations and determining air contaminant types; and, (h) outputting the determined air contaminant concentrations and air contaminant types.

In another embodiment, an aircraft air contaminant analyzer is provided comprising (a) at least one aircraft air contaminant collector comprising (i) a microporous medium comprising microporous flow-through channels and a chemoselective coating, wherein the microporous medium remains functional and desorbs captured air contaminants while being heated for a controlled time period; and, (ii) a thin film resistive heater, capable of heating to a temperature that vaporizes captured air contaminants, wherein the heater is in contact with the microporous medium; (b) a first substrate, having a top surface and a bottom surface; wherein the at least one contaminant collector is associated with the first substrate, the microporous medium and heater being thermally insulated from the first substrate; (c) a gravimetric sensor arranged to generate a proportionate resonant frequency response when air contaminant mass is added to or removed from the gravimetric sensor; (d) a second substrate, having a top surface and a bottom surface; wherein the gravimetric sensor is associated with the top surface of the second substrate, the gravimetric sensor being separated from the contaminant collector by a constant distance, the gravimetric sensor being arranged to receive air contaminants desorbed from the microporous medium when the microporous medium is heated; (e) a support comprising a top surface and a bottom surface, the support comprising at least one aircraft air inlet port passing through the top surface and the bottom surface of the support, wherein the bottom surface of the second substrate is associated with the top surface of the support; (f) a resonant frequency measurement device, arranged to measure the proportionate resonant frequency response generated by the gravimetric sensor as the air contaminant is added to and removed from the gravimetric sensor; (g) a computer readable medium bearing an air contaminant recognition program and calibration data; (h) a processor configured to execute the air contaminant recognition program, the contaminant recognition program including a module configured to classify air contaminant by type, and a module programmed to use the calibration data for comparison with magnitude of the proportionate resonant frequency response generated by the gravimetric sensor to calculate air contaminant concentration; and, (i) a pump, arranged to generate flow of aircraft air through the at least one aircraft air inlet port and through the at least one air contaminant collector before and after the microporous medium is heated.

In yet another embodiment, an aircraft air contaminant analyzer is provided comprising (a) two or more aircraft air contaminant collectors, each aircraft air contaminant collector separately comprising (i) a microporous medium comprising microporous flow-through channels and a chemoselective coating, wherein the microporous medium remains functional and desorbs captured air contaminants while being heated for a controlled time period; and, (ii) a thin film resistive heater, capable of heating to a temperature that vaporizes captured air contaminants, wherein the heater is in contact with the microporous medium; (b) a first substrate, having a top surface and a bottom surface; wherein each contaminant collector is associated with a separate first substrate, the microporous medium and heater being thermally insulated from the first substrate; (c) the analyzer further comprising gravimetric sensors arranged near each aircraft air contaminant collector, each sensor arranged to generate a proportionate resonant frequency response when air contaminant mass is added to or removed from the gravimetric sensor; (d) a second substrate, having a top surface and a bottom surface; wherein each gravimetric sensor is associated with the top surface of a separate second substrate, each gravimetric sensor being separated from the respective contaminant collector by a constant distance, each gravimetric sensor being arranged to receive air contaminants desorbed from the respective microporous medium when the microporous medium is heated; (e) a support comprising a top surface and a bottom surface, the support comprising at least one aircraft air inlet port passing through the top surface and the bottom surface of the support, wherein the bottom surface of each second substrate is associated with the top surface of the support; (f) a resonant frequency measurement device, arranged to measure the proportionate resonant frequency response generated by each gravimetric sensor as the air contaminant is added to and removed from the gravimetric sensor; (g) a computer readable medium bearing an air contaminant recognition program and calibration data; (h) a processor configured to execute the air contaminant recognition program, the contaminant recognition program including a module configured to classify air contaminant by type, and a module programmed to use the calibration data for comparison with magnitude of the proportionate resonant frequency response generated by at least one of the gravimetric sensors to calculate air contaminant concentrations; and, (i) a pump, arranged to generate flow of aircraft air through the at least one aircraft air inlet port and through the two or more air contaminant collectors before and after the microporous media are heated.

BRIEF DESCRIPTION OF THE SEVERAL
VIEWS OF THE DRAWING(S)

FIG. 1A is a diagrammatic representation of an illustrative aircraft air contaminant analyzer including an aircraft air contaminant collector comprising a microporous medium and a thin film resistive heater; the analyzer also including a gravimetric sensor; and a pump, according to an embodiment of the invention, also showing the flow of a sample through the aircraft air contaminant analyzer, wherein the gravimetric sensor is positioned upstream of the microporous medium with sample flow arranged to avoid flow toward the sensor's surface, and the pump is arranged downstream of the microporous medium to avoid contamination of the sample before it reaches the membrane.

FIG. 1B is a diagrammatic representation of an illustrative air craft air contaminant analyzer including two aircraft air contaminant collectors, each comprising a a microporous medium and a thin film resistive heater; the analyzer also comprising two gravimetric sensors; and a pump, according to an embodiment of the invention, also showing the flow of a sample through the aircraft air contaminant analyzer and the two aircraft air contaminant collectors, wherein the gravimetric sensors are positioned upstream of the microporous media with sample flow arranged to avoid flow toward the sensor surfaces, and the pump is arranged downstream of the membranes to avoid contamination of the sample before it reaches the microporous media.

FIG. 1C is a diagrammatic representation of an illustrative air craft air contaminant analyzer including two aircraft air contaminant collectors, each comprising a microporous medium and a thin film resistive heater; the analyzer also comprising two gravimetric sensors; and a pump, according to an embodiment of the invention, also showing the flow of a sample through the aircraft air contaminant analyzer having a single air inlet port, wherein the gravimetric sensors are positioned upstream of the microporous media with sample flow arranged to avoid flow toward the sensor surfaces, and the pump is arranged downstream of the microporous media to avoid contamination of the sample before it reaches the media.

FIG. 2 is a diagrammatic representation showing an illustrative gravimetric sensor (having first and second electrodes), the sensor also including a balance capacitor (having first and second balance capacitor electrodes) as part of an aircraft air contaminant analyzer according to an embodiment of the invention.

FIG. 3A is a diagrammatic top view of an embodiment of the air contaminant collector shown in FIG. 1A, showing the microporous membrane, also showing a chemoselective coating on the membrane, and the thin film resistive heater, also showing a base, and tethers, wherein the tethers connect the microporous membrane to the base. FIG. 3B is a diagrammatic enlarged view of a portion of the embodiment of the air contaminant collector shown in FIG. 3A, showing channels in the base providing tethers for connecting the microporous membrane to the base, also showing the thin film resistive heater associated with the top surface of the microporous membrane (surrounding the flow-through channels of the microporous membrane), and on the tethers, also showing electrical traces and the chemoselective coating, wherein only portions of the coating and the heater are shown so that other components can also be shown. FIG. 3C shows an enlarged view of the bottom surface of the microporous membrane, also showing the bottom surfaces of the tethers connecting the microporous membrane to the base. FIG. 3D is a diagrammatic cross-sectional view of an embodiment of the air contaminant collector with the coating, also showing electrical traces, and an insulator layer, wherein the traces are on top of the heater and insulating layer, and the insulating layer forms the top surface of the microporous membrane.

DETAILED DESCRIPTION OF THE INVENTION

Figure 2:
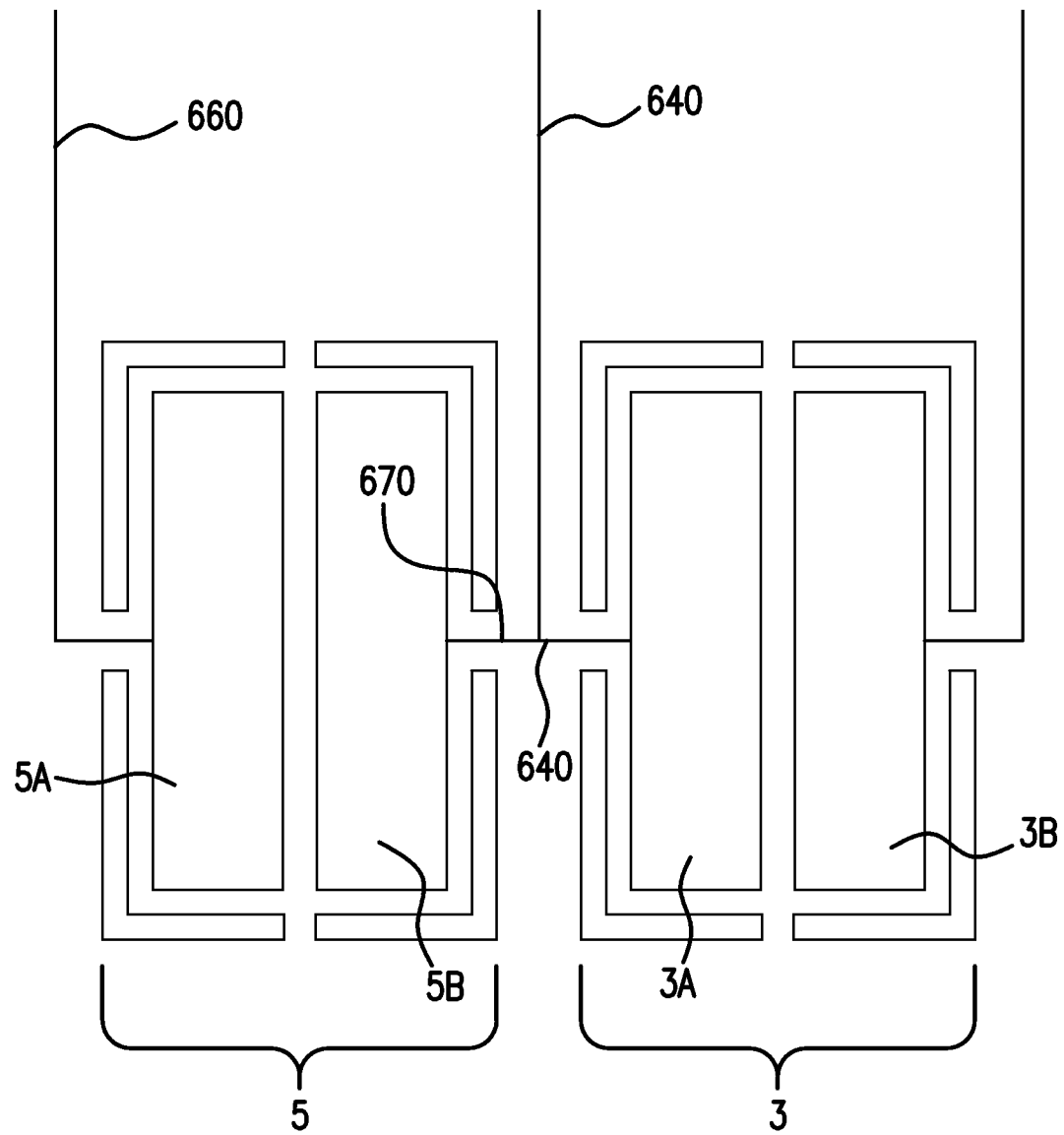

In accordance with an embodiment of the invention, a method for determining and classifying by type aircraft air contaminants is provided, (a) passing aircraft air through an aircraft air contaminant analyzer comprising at least one aircraft air contaminant collector comprising: (i) a microporous medium comprising microporous flow-through channels, the microporous medium having a chemoselective coating; and (ii) a thin film resistive heater, capable of heating to a temperature that vaporizes captured air contaminants, wherein the heater is in contact with the microporous medium; (b) capturing air contaminants by the microporous medium; (c) discontinuing passing aircraft air through the at least one aircraft air contaminant collector; (d) heating the microporous medium to a temperature sufficient to vaporize the captured air contaminants and desorb the captured air contaminants; (e) receiving the desorbed air contaminants on a gravimetric sensor arranged to generate a proportionate resonant frequency response when air contaminant mass is added to or removed from the gravimetric sensor; (f) measuring the proportionate resonant frequency response generated by the gravimetric sensor as the air contaminant is added to and removed from the gravimetric sensor; (g) executing an air contaminant recognition program stored upon a computer-readable medium, including calculating air contaminant concentration and determining air contaminant type; and, (h) outputting the determined air contaminant concentration and air contaminant type.

In another embodiment of the invention, the method comprises (a) passing aircraft air through an aircraft air contaminant analyzer comprising two or more aircraft air contaminant collectors, each collector comprising: (i) a microporous medium comprising microporous flow-through channels, the microporous medium having a chemoselective coating; and (ii) a thin film resistive heater, capable of heating to a temperature that vaporizes captured air contaminants, wherein the heater is in contact with the microporous medium; (b) capturing air contaminants by each microporous medium; (c) discontinuing passing aircraft air through the two or more aircraft air contaminant collectors; (d) heating each microporous medium to a temperature sufficient to vaporize the captured air contaminants and desorb the captured air contaminants; (e) receiving the desorbed air contaminants from each of the two or more aircraft air contaminant collectors onto a gravimetric sensor, each gravimetric sensor being arranged to generate a proportionate resonant frequency response when air contaminant mass is added to or removed from the gravimetric sensor; (f) measuring the proportionate resonant frequency response generated by each gravimetric sensor as the air contaminant is added to and removed from each gravimetric sensor; (g) executing an air contaminant recognition program stored upon a computer-readable medium, including calculating air contaminant concentrations and determining air contaminant types; and, (h) outputting the determined air contaminant concentrations and air contaminant types.

In another embodiment, an aircraft air contaminant analyzer is provided (a) at least one aircraft air contaminant collector comprising (i) a microporous medium comprising microporous flow-through channels and a chemoselective coating, wherein the microporous medium remains functional and desorbs captured air contaminants while being heated for a controlled time period; and, (ii) a thin film resistive heater, capable of heating to a temperature that vaporizes captured air contaminants, wherein the heater is in contact with the microporous medium; (b) a first substrate, having a top surface and a bottom surface; wherein the at least one contaminant collector is associated with the first substrate, the microporous medium and heater being thermally insulated from the first substrate; (c) a gravimetric sensor arranged to generate a proportionate resonant frequency response when air contaminant mass is added to or removed from the gravimetric sensor; (d) a second substrate, having a top surface and a bottom surface; wherein the gravimetric sensor is associated with the top surface of the second substrate, the gravimetric sensor being separated from the contaminant collector by a constant distance, the gravimetric sensor being arranged to receive air contaminants desorbed from the microporous medium when the microporous medium is heated; (e) a support comprising a top surface and a bottom surface, the support comprising at least one aircraft air inlet port passing through the top surface and the bottom surface of the support, wherein the bottom surface of the second substrate is associated with the top surface of the support; (f) a resonant frequency measurement device, arranged to measure the proportionate resonant frequency response generated by the gravimetric sensor as the air contaminant is added to and removed from the gravimetric sensor; (g) a computer readable medium bearing an air contaminant recognition program and calibration data; (h) a processor configured to execute the air contaminant recognition program, the contaminant recognition program including a module configured to classify air contaminant by type, and a module programmed to use the calibration data for comparison with magnitude of the proportionate resonant frequency response generated by the gravimetric sensor to calculate air contaminant concentration; and, (i) a pump, arranged to generate flow of aircraft air through the at least one aircraft air inlet port and through the at least one air contaminant collector before and after the microporous medium is heated.

In yet another embodiment, an aircraft air contaminant analyzer is provided comprising (a) two or more aircraft air contaminant collectors, each aircraft air contaminant collector separately comprising (i) a microporous medium comprising microporous flow-through channels and a chemoselective coating, wherein the microporous medium remains functional and desorbs captured air contaminants while being heated for a controlled time period; and, (ii) a thin film resistive heater, capable of heating to a temperature that vaporizes captured air contaminants, wherein the heater is in contact with the microporous medium; (b) a first substrate, having a top surface and a bottom surface; wherein each contaminant collector is associated with a separate first substrate, the microporous medium and heater being thermally insulated from the first substrate; (c) the analyzer further comprising gravimetric sensors near each aircraft air contaminant collector, each gravimetric sensor arranged to generate a proportionate resonant frequency response when air contaminant mass is added to or removed from the gravimetric sensor; (d) a second substrate, having a top surface and a bottom surface; wherein each gravimetric sensor is associated with the top surface of a separate second substrate, each gravimetric sensor being separated from the respective contaminant collector by a constant distance, each gravimetric sensor being arranged to receive air contaminants desorbed from the respective microporous medium when the microporous medium is heated; (e) a support comprising a top surface and a bottom surface, the support comprising at least one aircraft air inlet port passing through the top surface and the bottom surface of the support, wherein the bottom surface of each second substrate is associated with the top surface of the support; (f) a resonant frequency measurement device, arranged to measure the proportionate resonant frequency response generated by the gravimetric sensor as the air contaminant is added to and removed from the gravimetric sensor; (g) a computer readable medium bearing an air contaminant recognition program and calibration data; (h) a processor configured to execute the air contaminant recognition program, the contaminant recognition program including a module configured to classify air contaminant by type, and a module programmed to use the calibration data for comparison with magnitude of the proportionate resonant frequency response generated by the gravimetric sensor to calculate air contaminant concentrations; and, (i) a pump, arranged to generate flow of aircraft air through the at least one aircraft air inlet port and through the two or more air contaminant collectors before and after the microporous media are heated.

Advantageously, embodiments of the aircraft air contaminant analyzer according to the invention are not "single use," e.g., they are resistant to fouling and can be used to repeatedly measure the contaminant concentration(s) and determine the contaminant type(s).

In another advantage, particularly when two or more aircraft air contaminant collectors are utilized, different fluids with similar properties (e.g., vapor pressure and/or density) can be more accurately classified.

In a typical embodiment, an aircraft air contaminant analyzer can be located in the ECS (Environmental Control System) vent or duct since there will be a delay before the contaminant concentration in the large volume cabin increases to the level coming out of the ECS vents. However, a variety of locations are suitable for an analyzer, such as, e.g., in the cockpit, cabin, overhead luggage compartment, storage compartment, galley area, avionics bay, auxiliary power units, etc. Alternatively, an analyzer can be installed in one location and air from another location directed to the analyzer via a variety of air transfer devices including, e.g., piping, tubing, and/or ducts.

Alternatively, or additionally, an aircraft air contaminant analyzer can be located, e.g., at or near a bleed air line, wherein pressurized air from an engine is transferred to the ECS. One benefit of an aircraft air contaminant analyzer at or near the bleed air line is that sampling bleed air from each engine informs and can identify which engine is faulty, allowing the crew to stop supplying contaminated bleed air from a faulty engine to the ECS. In contrast, an aircraft air contaminant analyzer located in the cabin, whether sampling from the cabin or ECS vent or ECS duct will inform there is a contaminant source, but not which engine or APU (auxiliary power unit) is the source of contamination.

In accordance with a preferred embodiment of a method for determining and classifying by type aircraft air contaminants according to the invention, while repeatedly measuring the gravimetric sensors' response, the aircraft air contaminant collector's microporous medium (e.g., microporous membrane) is heated to vaporize the collected contaminants such that the vaporized contaminants are transferred to the gravimetric sensor to be measured. The measurement rate is sufficient to resolve the gravimetric sensor's response, which is in the shape of the sensor's frequency versus time curve as it absorbs and subsequently desorbs contaminants released from the microporous medium.

The analyzer includes a measurement circuit to measure frequency at a sufficient rate to precisely resolve the gravimetric sensor's response, typically about 10 to about 100 measurements per second per gravimetric sensor. Measurement is synchronized with other analyzer functions, particularly, the function of heating the microporous medium. Measurement is typically over a duration sufficient to resolve the maximum frequency change and the rate of recovery of the gravimetric sensor's response, typically, for example, a duration of about 1 second to about 4 seconds long.

A sufficient volume of sample at a prescribed rate (for example, about 500 to about 2000 standard cubic centimeter per minute (sccm)) for a prescribed period of time (for example, about 10 to about 60 seconds) is flown through the analyzer to achieve a response magnitude sufficiently over the measurement noise level to resolve the shape of the sensor's frequency versus time curve, typically, a signal-to-noise ratio of about 4:1 or greater.

The kinetics of transfer, adsorption and desorption of the different contaminants results in different response shapes. Illustratively, if 4 different compounds (e.g., nitromethane triacetone triperoxide, ethylene glcol dinitrate, and 2,3 dimethyl 2,3 dinitrobutane) were superimposed on a single graph for ease of reference, the shape of sensor frequency versus time responses for the compounds would show that the higher vapor pressure (lighter) compounds are released from the membrane more quickly than the lower vapor pressure (heavier) compounds, e.g., nitromethane is released before triacetone triperoxide, ethylene glcol dinitrate, and 2,3 dimethyl 2,3 dinitrobutane.

The flow through the microporous medium in each aircraft air contaminant collector should be stopped such that it is zero or nearly zero (e.g., about 5 sccm or less) before the microporous medium is heated, e.g., typically, flow should be stopped for at least 0.2 seconds before heating. Preferably, while repeatedly measuring frequency, the microporous medium is heated by applying a voltage step bringing it to a temperature of at least about 400° C. in about 0.1 seconds. Typically, the microporous medium is heated to at least about 200° C., more typically, at least about 400° C., in some embodiments, to about 550° C., for at least about 1 second, preferably, at least about 2 seconds (e.g., up to about 10 seconds, or more), to vaporize (desorb) the contaminant(s) so that the next measurement can begin from a "fresh start." In order to zero out ("self-zero") gravimetric sensor drift, the sensor's response is referenced to the frequency the sensor had just before heating the microporous medium.

When the microporous medium is not being heated, the analyzer is preferably maintained at a fixed temperature, e.g., a fixed temperature in the range of from about 30° C. to about 70° C.

The contaminant(s) can be classified by type using a pattern recognition algorithm to recognize each contaminant by its unique response, the shape of the sensor's frequency versus time curve, which is influenced by the contaminant's material properties such as, but not limited to, one or more of any of the following: vapor pressure, heat capacity, heat of condensation, heat of evaporation, absorption and desorption kinetics, and diffusion rate. A variety of algorithms can be used to classify the contaminant(s) from the contaminant-specific response shape. Suitable algorithms include, for example, neural nets, principal component analysis, support vector machine based classification, linear discriminant analysis and decision tree analysis.

Concentration of the contaminant(s) can be calculated by comparing the magnitude of the response(s) to a pre-determined calibration file, e.g., a curve or lookup table giving values for the contaminant concentration(s) as a function of the magnitude of the response(s).

The gravimetric sensor (which can comprise a single sensor or a sensor array) generates a precise and proportionate frequency response to mass added or removed from the sensor. Preferably, the response is provided over a wide dynamic range, such that it is not over-dampened by small quantities of transferred contaminant (analyte). The gravimetric sensor is operated as part of an amplified oscillator circuit to maintain it at resonance.

Each of the components of the invention will now be described in more detail below, wherein like components have like reference numbers.

FIGS. 1A-1C show illustrative embodiments of aircraft air contaminant analyzers. As will be discussed in more detail below, the illustrated embodiment shown in FIG. 1B is similar to that shown in FIG. 1A, but includes two aircraft air contaminant collectors, two gravimetric sensors, and two additional aircraft air inlet ports, and the illustrated embodiment shown in FIG. 1C is similar to that shown in FIG. 1B, but includes a single air inlet port and an inlet manifold including a manifold air inlet port.

In the illustrative embodiments shown in FIG. 1A-1C, an aircraft air contaminant analyzer 200 comprises an (or a first) aircraft air contaminant collector 1 comprising a base 10 comprising a first substrate 101I (shown in FIGS. 3A and 3D) and a microporous medium 100 (e.g., a microporous membrane 100A) comprising microporous flow-through channels and a chemoselective coating 150, and a thin film resistive heater 175. The illustrated aircraft air contaminant collector also comprises a (or a first) gravimetric sensor 3, and a pump, as well as other components as discussed in more detail below.

The illustrative embodiments shown in FIGS. 1B and 1C also comprise a second aircraft air contaminant collector 1' and a second gravimetric sensor 3'.

Using FIGS. 3A-3D for reference, illustrating an aircraft air contaminant collector (since first aircraft air contaminant collector 1 and a second aircraft air contaminant collector 1' have the same components, FIGS. 1B and 1C list the components of the second aircraft containment collector (as well as of the aircraft air contaminant analyzer 200 and the second gravimetric sensor as discussed in more detail below) with a "'", e.g., 10', 101I', 100', etc.), first aircraft air contaminant collector 1 comprises a base 10, comprising a first substrate 101I, comprising a first substrate primary layer 101 having a first substrate top layer 101A and a first substrate bottom layer 101B (FIG. 3D), and a porous medium 100 (e.g., a microporous membrane 100A) on the first substrate, the porous medium having a top surface 111 and a bottom surface 112 (FIGS. 3C and 3D), the porous medium comprising microporous flow-through channels 115 (through the top surface and the bottom surface of the porous medium) and a chemoselective coating 150 (shown in FIGS. 3A, 3B, and 3D), wherein the porous medium remains functional and desorbs captured air contaminants while being heated for a controlled time period, and a thin film resistive heater 175, capable of heating to a temperature that vaporizes captured air contaminants, wherein the heater is in contact with (in and/or on) the top surface of the porous medium; wherein the layers 101A and 101B, the porous medium 100, the heater 175, wire traces 620 (that can communicate with wirebonds (not shown) communicating with the heater 175) and an optional packaging layer 699 (covering at least a portion of the wire traces, e.g., providing low resistance and allowing the wirebonds to form a reliable electrical contact and more efficiently move heater current from the wirebonds to the heater) are associated with (e.g., mounted to or fabricated on) the first substrate primary layer 101 by, for example, additive processes, and channels 115 and tethers 190 (discussed below), as well as the cavity below the porous medium 100 (shown in FIG. 3D) are fabricated by, for example, subtractive processes.

While FIGS. 3A-3D show a first substrate 101I' comprising a first substrate primary layer 101 having a first substrate top layer 101A and a first substrate bottom layer 101B, it should be recognized by one of skill in the art that other processes for forming the porous medium 100 may not require layers 101A and/or 101B.

Figure 3A:
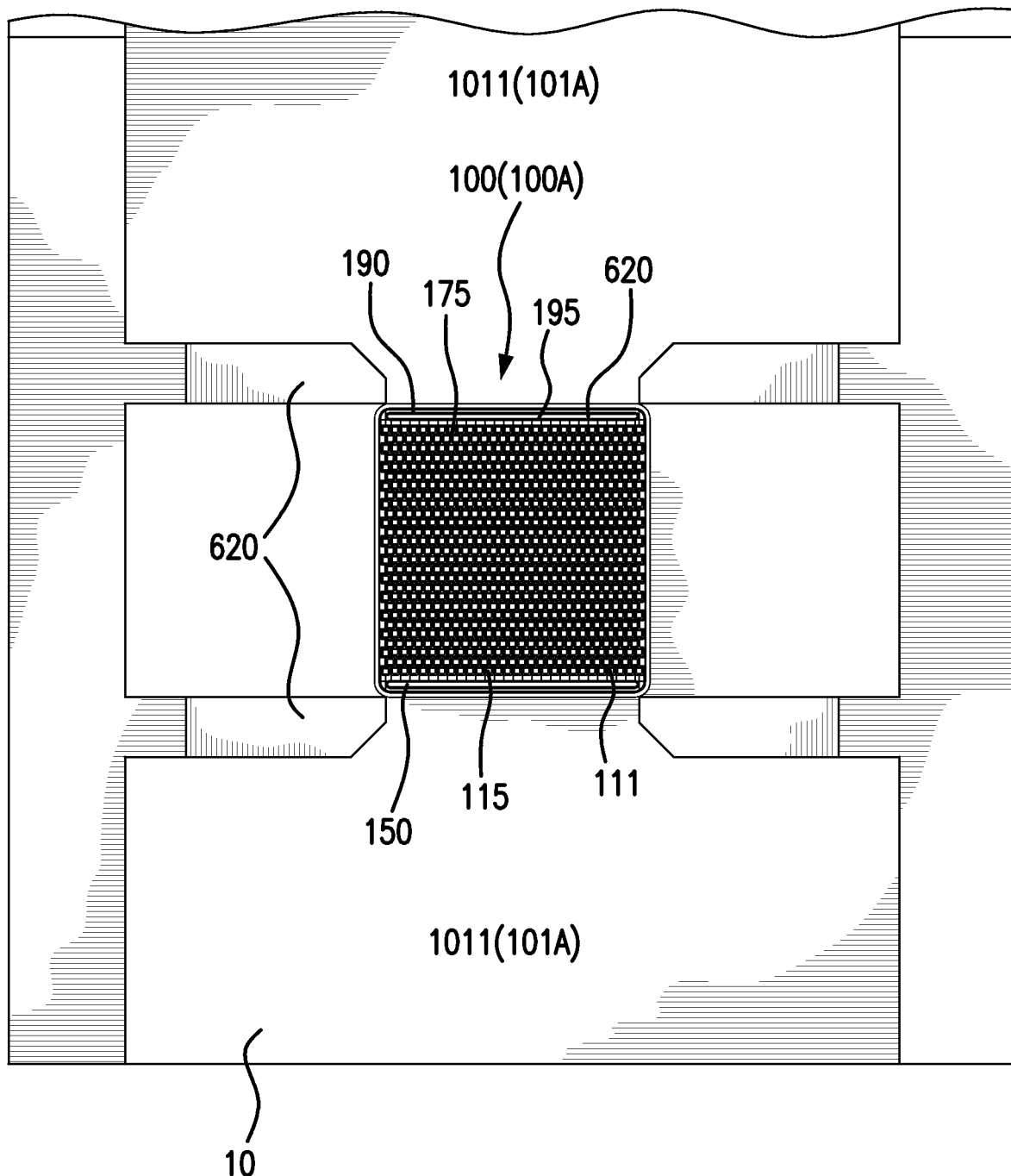
Figure 3B:
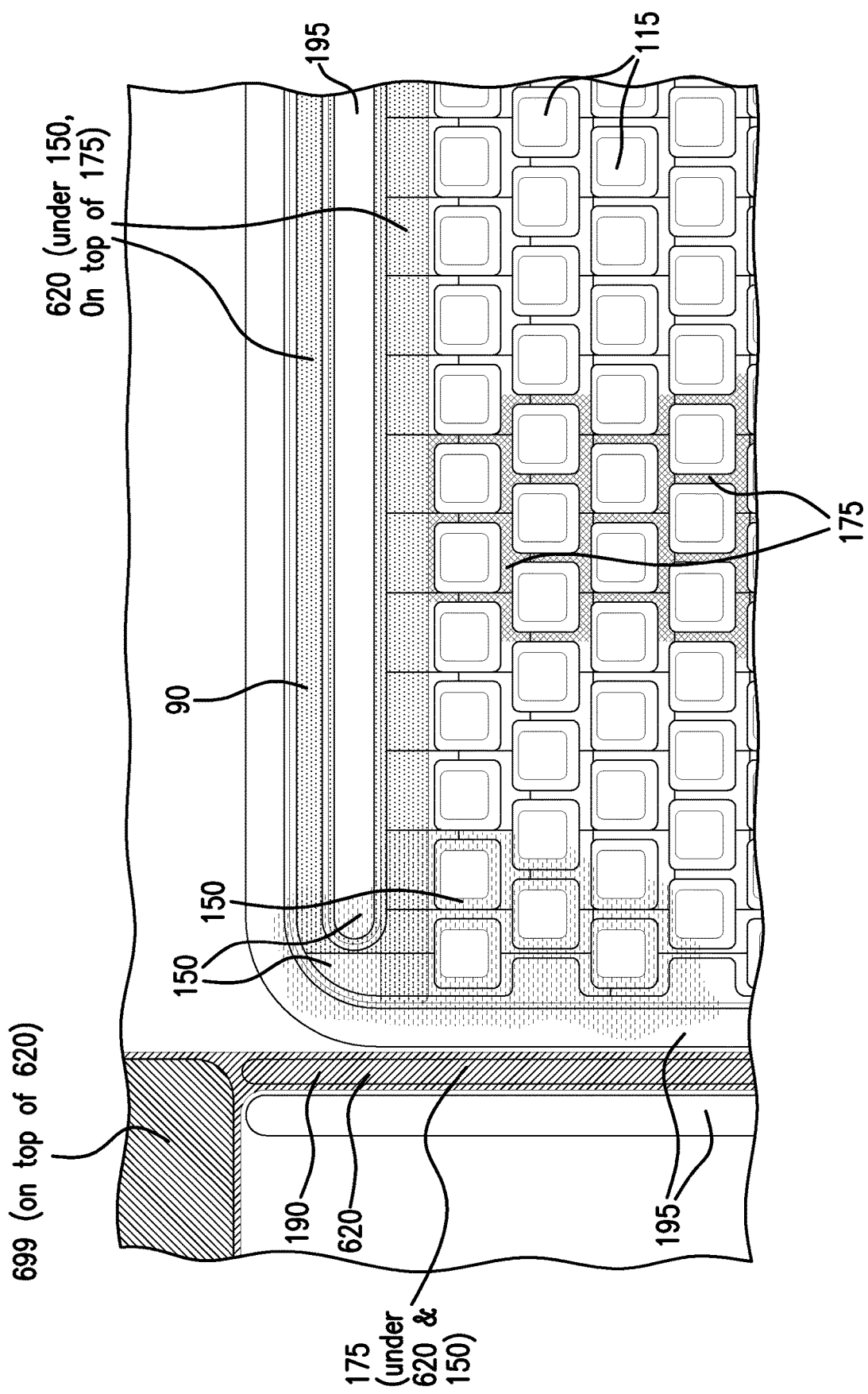
Figure 3C:
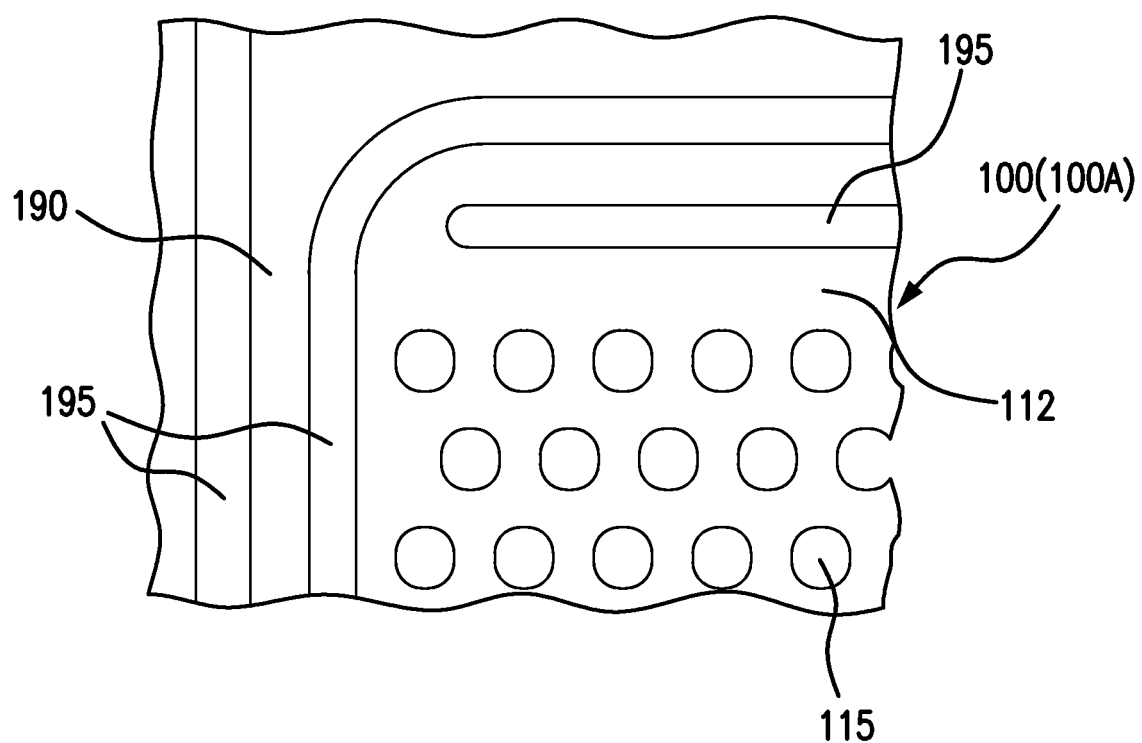

Typically, the chemoselective coating 150 covers all surfaces of the membrane (e.g., top, bottom, the flow-through channels; coating in channels/pores not shown in FIG. 3B) as well as the top of the heater and electrical traces, without covering the packaging layer 699.

Figure 3D:
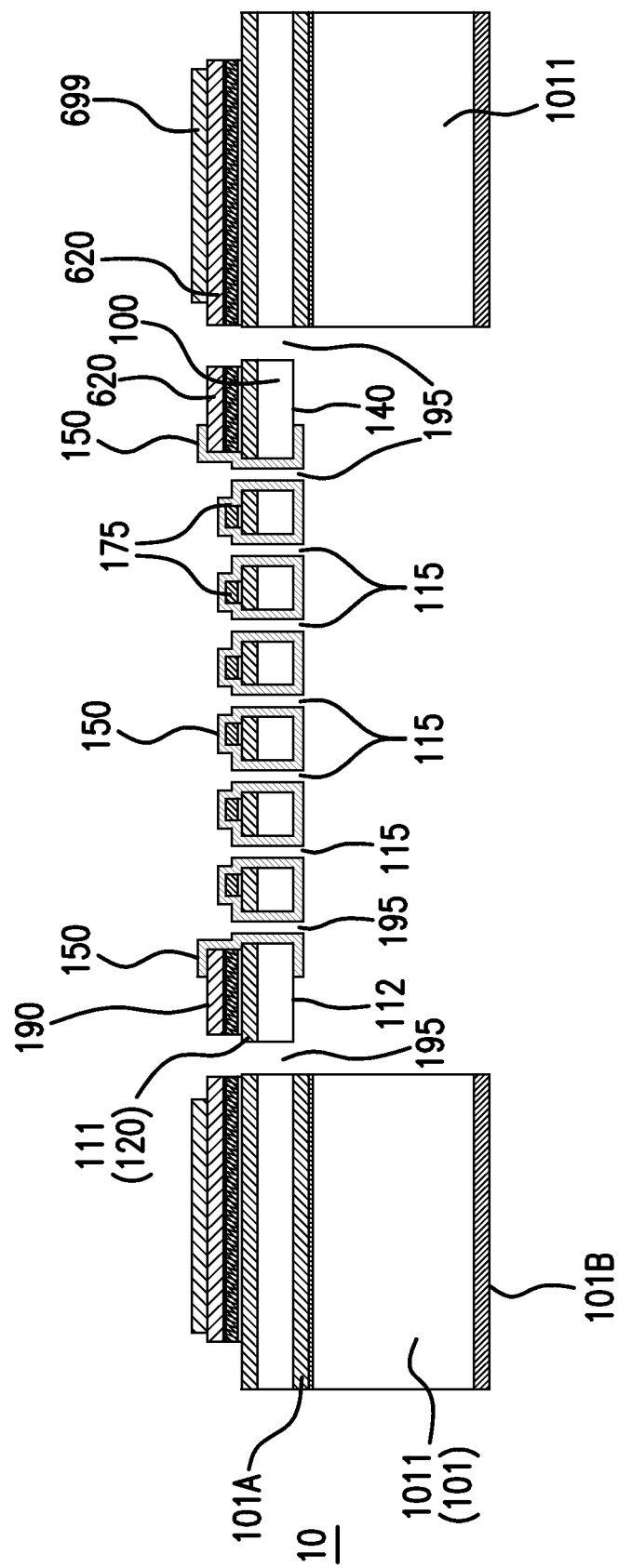

Preferably, the porous membrane and heater are thermally insulated from the base 10 and the first substrate 101I, for example, the porous member is thermally insulated from 101, 101A, and 101B (e.g., by tethers 190 connecting the porous member to the substrate, e.g., as shown in FIGS. 3A, 3B, and 3D) to reduce conductive heat loss at the edges of the porous member, also allowing rapid and uniform heating with low power. In an embodiment, channels 195 are etched through the first substrate, and define the tethers (e.g., the tethers are portions of the first substrate remaining after channels have been etched therethrough). In contrast with the flow-through channels 115 (typically having a diameter of about 50 micrometers or less), the channels 195 are typically elongated, and define the tethers.

In the embodiment illustrated in FIGS. 3B and 3D, the thin film resistive heater 175 is arranged in or on the top surface 111 of the porous membrane (surrounding the flow-through channels 115 of the porous membrane), and on the tethers.

In some embodiments, e.g., as illustrated diagrammatically in FIG. 3D, the top surface 111 of the porous member comprises an insulating layer 120 (e.g., SiO$_2$) underneath the heater (and any other structure carrying current, e.g., electrical traces) to prevent current from shorting through the porous membrane.

The embodiments of the analyzers 200 shown in FIGS. 1B and 1C include an additional aircraft air contaminant collector having the same components as described in FIG. 1A, and FIGS. 3A-3D (this will also apply to the description of the additional gravimetric sensor, as discussed in more detail below). For ease of reference, the additional aircraft air contaminant collector is given the reference number 1' comprising a base 10' comprising a first substrate 101' and a microporous medium 100' (e.g., a microporous membrane 100A') comprising microporous flow-through channels and a chemoselective coating 150', and a thin film resistive heater 175', preferably, wherein the microporous medium and heater are thermally insulated from the base and the first substrate as described above.

In these illustrated embodiments, the aircraft air contaminant collectors 1, 1' are associated with (e.g., mounted on) a first support 311, typically a printed circuit board (PCB), the first support having a top surface 311A and a bottom surface 311B.

The analyzer 200 includes a (or a first) gravimetric sensor 3, arranged near each collector to generate a proportionate resonant frequency response when air contaminant mass is added to or removed from the gravimetric sensor, for quantifying the amount of air contaminant and classifying air contaminant by type; and a second substrate 201, having a top surface 201A and a bottom surface 201B; wherein the gravimetric sensor 3 is associated with (e.g., mounted on or fabricated within, e.g., by subtractive and additive processes) the top surface of the second substrate, the gravimetric sensor being separated from the contaminant collector by a constant distance, the gravimetric sensor being arranged to receive air contaminants desorbed from the microporous medium when the microporous medium is heated.

As noted above, the embodiments shown in FIGS. 1B and 1C include an additional (or second) gravimetric sensor having the same components as described in FIG. 1A, so for ease of reference, the components of the second gravimetric sensor are listed with a "'", e.g., 3', 201', etc.).

The embodiments of the analyzers shown in FIGS. 1A-1C (some components are only labeled on FIG. 1A or only labeled on FIG. 1B or only labeled on FIG. 1C) also include a second support 312 comprising a top surface 312A and a bottom surface 312B, the second support comprising at least one aircraft air inlet port 500 (FIG. 1A shows two air inlet ports 500A, 500B providing an air flow path 1000 passing through the air contaminant collector 1); FIG. 1B shows three air inlet ports 500A' (providing air flow path 1000' passing through the air contaminant collector 1'); 500B (providing air flow path 1000 passing through the air contaminant collector 1); and 500C (wherein air inlet port 500C allows air to flow via air flow path 1000" through the first and second aircraft air contaminant collectors 1, 1'); and FIG. 1C shows one air inlet port 500C (that allows air to flow via air flow path 1000" through the first and second aircraft air contaminant collectors 1, 1') passing through the top surface and the bottom surface of the support, wherein the bottom surface of the second substrate is associated with (e.g., mounted on) the top surface of the second support. Embodiments of the invention can include an optional inlet manifold including an air inlet port, and FIG. 1C shows an optional inlet manifold 510 including a manifold air inlet port 500D. Typically, the second support comprises a PCB.

Separation between the gravimetric sensor and the microporous medium should be kept constant, typically at a distance of about 0.1 mm to about 2 mm, preferably about 0.2 mm to about 0.4 mm. For example, FIGS. 1A-1C show spacers 315 between the first support 311 and the second support 312 for maintaining the spacing between the sensor and the microporous medium. Preferably, the length of the spacers is such that the separation between the collector and the gravimetric sensor facing surfaces are about 0.2 mm to about 0.4 mm.

The embodiments shown in FIGS. 1A-1C also include electronics 600 comprising a power source or a connection to a power source, a power regulator, a measurement circuit 610 comprising a resonant frequency measurement device 610A comprising an oscillator and a field-programmable gate array (FPGA), arranged to measure the proportionate resonant frequency response generated by the resonator array to allow classification of air contaminant type(s); a computer readable medium bearing an air contaminant recognition program; a processor configured to execute the air contaminant recognition program, the contaminant recognition program including a module configured to measure oscillation rate and classify air contaminant type(s), and programmed with a calibration table for comparison with magnitude of the proportionate resonant frequency responses generated by the resonator array(s) to calculate air contaminant concentration(s) and determine air contaminant type(s). If desired, the air contaminant recognition program executed by the processor is stored upon a non-transitory computer-readable medium, and the processor displays (outputs) a value for the determined air contaminant type(s). For example, the value(s) can be displayed through a GUI using a display device (such as a hand-held device) operably arranged with the processor. Alternatively, or additionally, for example, the value(s) can be displayed by an illuminated indicator or communicated audibly.

Figure 5:
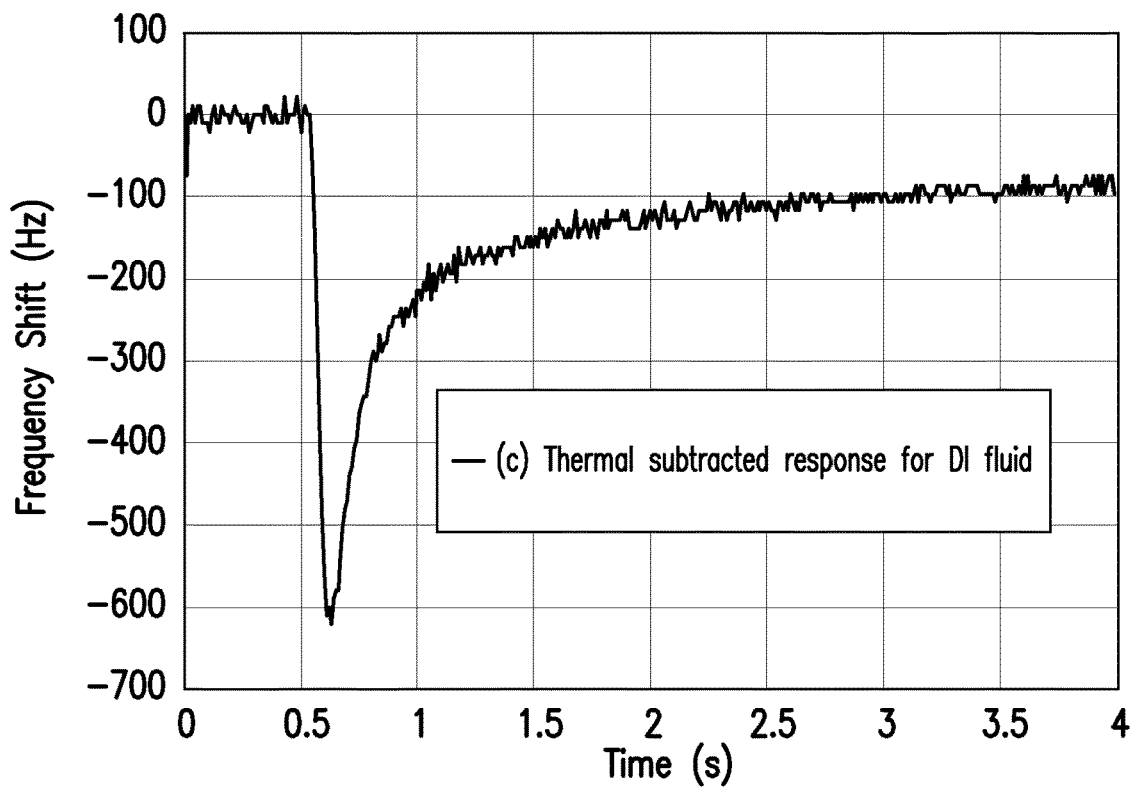
FIG. 5 shows the "thermal subtracted response" resulting from subtracting the response spectra for the absence of a contaminant (deicing fluid) from the response spectra in the presence of deicing fluid.

The electronics can have a variety of arrangements as known in the art. In the illustrated embodiments shown in FIGS. 1A-1C, the electronics provide power when needed to the respective heater 175, 175' via a cable 601, 601', connector 605, 605', electrical traces 620, 620' fabricated into first support 311 (so traces not visible), wirebonds 625, 625', and traces 630, 630' fabricated onto collector 10 (so traces not visible), and power to the pump 433 (discussed below) when needed via cable 690. The electronics with respect to the gravimetric sensors can also include, for example, electrical trace 640, 640', wirebonds 645, 645', electrical traces 650, 650' fabricated into second support 312 (so traces 650, 650' not visible), 660, 670 (as shown in FIG. 5), connector 655, and cable 651, 651'.

In those embodiments including additional collectors and gravimetric sensors, each gravimetric sensor would typically have its own oscillator circuit, electrical traces and wirebonds. They may have separate cables and connectors, or signals may be routed into multi-wire cables and connectors. One field programmable gate array (FPGA) is typically capable of counting the resonant frequencies of multiple gravimetric sensors. All collectors can be wired in parallel and heated from the same electronics power circuit, or alternately can be powered by separate circuits and heated independently, for example to different temperatures or durations.

If desired, resonance frequency can be measured using, for example, a phase lock loop or a digital signal processor (DSP) chip to perform frequency sweeps to identify the resonant frequency from the sweep spectra.

Alternatively, if desired, a resonant frequency measurement device comprising a laser and a photodetector can be arranged to measure the proportionate resonant frequency response generated by the gravimetric sensor.

The illustrated embodiments also include a pump 433, arranged to generate aircraft air sample flow through the aircraft air inlet port(s) and through the air contaminant collector(s) before and after the microporous medium/media is/are heated, and a variety of pumps are suitable for use in accordance with embodiments of the invention. As shown in FIGS. 1A-1C, the pump 433 is preferably positioned downstream of the one or more microporous media and the one or more sensors, wherein an optional air-tight cover 434 and/or an optional inlet manifold 510, second support 312, first support 311, and spacer 315 isolate the sample to avoid its contamination or dilution, and to ensure that flow generated by the pump all flows through the microporous medium/media, and the pump is positioned after the gravimetric sensor(s) and the microporous medium/media to ensure that the pump does not contaminate the sample, and the gravimetric sensor(s) is/are positioned upstream of the microporous medium/media with sample flow arranged to avoid flow toward the respective sensor surfaces, thus minimizing the transfer of contaminants and undesirable material (such as dust, aerosols, and/or particulates) onto the surface(s) of the sensor(s).

In those embodiments including two or more aircraft air contaminant collectors and corresponding gravimetric sensors (providing a collector-sensor set), each collector-sensor set is maintained at the same environmental conditions (e.g., temperature, pressure, relative humidity) as the other set(s), as this provides better detection performance by reducing "noise" in the response patterns caused by measuring each set at different times or under different conditions. Preferably, all of the collector-sensor sets are arranged in close proximity.

Each collector-sensor set should have similar sensitivity as the other set(s) such that each provides responses above the noise level to provide good accuracy.

A variety of gravimetric sensors 3, 3' are suitable for use in embodiments of the invention, including, for example, gravimetric sensors selected from a thin film resonator (TFR), a surface acoustic wave (SAW) resonator, a thickness sheer mode (TSM) resonator (quartz crystal microbalance (QCM) resonator), an acoustic plate mode (APM) resonator, a flexural plate wave (FPW) resonator, a bulk acoustic wave (BAW) resonator, a piezoelectric bimorph resonator array sensor, and a tuning fork sensor.

In an embodiment, the sensor can be coated with functionalized $SiO_2$ nanoparticles (e.g., functionalized with tri-ethyoxysilanes) Suitable tri-ethyoxysilanes for producing functionalized $SiO_2$ nanoparticles include, for example, 3-[2-(3-Triethoxysilylpropoxy)ethoxy] sulfonlane, 95%; Phenethyltrimethoxysilane, tech-95; 3-Methyoxypropyltrimethoxysilane; N-(Acetylglycl)-3-Aminopropyltrimethoxysilane, 5% in methanol; and Dodecafluorodec-9-Ene-1-Yltrimethoxysilane, 95%. In some embodiments, the functionalized $SiO_2$ nanoparticles form self-assembled monolayers that can be deposited on the surface of the sensor.

In one embodiment, the gravimetric sensor comprises a piezoelectric bimorph resonator array comprising two active layers, the layers bending under resonance, the resonator array generating a proportionate change in resonant frequency upon the addition or removal of air contaminant mass. One example of such a gravimetric sensor is disclosed in U.S. Pat. No. 6,953,977.

In an embodiment shown in FIG. 2, the gravimetric sensor 3 includes a first electrode 3A and a second electrode 3B (collectively forming a resonator or gravimetric sensor array) so that motion of the sensor is transduced into an electrical signal via the first electrode on the surface of the sensor. The signal is routed to the electronics 600 via, for example, electrical traces 640 on the sensor (e.g., a gravimetric sensor array), wirebonds 645, and electrical traces 650 on the second support (e.g., PCB) 312 onto which the gravimetric sensor is mounted, connector 655, and cable 651. The signal can be amplified and returned to the second electrode on the sensor surface to drive the sensor at resonance. The gravimetric sensor can further comprise an optional balance capacitor 5 (comprising a first balance capacitor electrode 5A and a second balance capacitor electrode (measuring electrode) 5B) included adjacent to the resonator to reduce the contributions of parasitic capacitances and resistances from the electrical signal, wherein the balance capacitor has similar or identical materials of construction and dimensions as the gravimetric sensor but is made incapable of motion (e.g., wherein there is no space on the substrate allowing the balance capacitor to move). The balance capacitor can be driven with, for example, a 180° phase shifted signal through a dedicated electrical trace 660 to the first balance capacitor electrode 5A. The signal transduced from the second balance capacitor electrode (measuring electrode) 5B can be combined (e.g., via trace 670) with the signal transduced by the sensor's first electrode 3A as it is routed (e.g., via trace 640) to the electronics 600, e.g., a field programmable gate array (FPGA) and firmware that counts the rate of oscillation.

As recognized in the art, a variety of types of electronics are suitable for measuring the proportional frequency responses of the various gravimetric sensors.

A variety of materials are suitable for microporous media (e.g., microporous membranes) for use in accordance with embodiments of the invention. In addition to microporous membranes, suitable microporous media include fibrous materials, ceramics, printed structures, and micromachined structures. The microporous medium can be supported or unsupported. Typically, in those embodiments wherein the microporous medium is a microporous membrane, the membrane has a thickness in the range of at least about 20 micrometers to about 500 micrometers, more typically, a thickness in the range of about 50 micrometers to about 200 micrometers, though membranes can have lesser or greater thicknesses for some applications.

The microporous medium, e.g., the microporous membrane, is porous or perforated, providing suitable regular and/or irregular flow through channels and/or pores, e.g., about 5 micrometers to about 50 micrometers, typically, a 10 micrometers to about 30 micrometers, in size and/or diameter, though the pores or perforations can be smaller or larger for some applications. The membrane includes a chemoselective coating associated with (e.g., affixed and/or covalently bonded to) the top and bottom surfaces and the inside of the flow channels and/or pores and/or chemoselective particles in the bulk of the membrane.

A variety of chemoselective coatings are suitable for use in embodiments of the invention, e.g., porous silica, activated carbon, metal-organic frameworks (MOFs), zeolitic imidazolate frameworks (ZIFs), titania ($TiO_2$) particles, and zeolites, including hydrophobic zeolites and hydrophilic zeolites. Suitable zeolite coatings include, but are not limited to, Z100 (hydrophobic zeolite); Z110 (hydrophobic zeolite); Z300 (less hydrophobic zeolite); and Z810 (hydrophilic zeolite) (Zeochem LLC, Louisville, Ky.).

Suitable heaters, preferably, thin film resistive heaters, are known in the art. Illustrative heaters include, for example, platinum (Pt) and tantalum-platinum (TaPt) high temperature compatible thin film resistive heaters, which allow the microporous medium to be ohmically heated to, for example, about 550° C. without degradation. Preferably, the heater is fabricated in place onto the substrate, e.g., with a combination of deposition, lithography, and dissolution, processes.

A variety of materials are suitable for use as the first and second supports, the collector die, and the substrates, and suitable materials are known in the art and are readily manufacturable using microelectronics fabrication processes. For example, they can be fabricated from materials such as silicon. Typically, the materials are micromachinable, as they desirably allow micromachining to include, if desired, electrical structures such as traces, electrodes, and interconnects to bring electrical power where needed, and/or include mechanical structures such as suspended plates, tethers and membranes, and fluidic structures such as flow channels.

The following examples further illustrate the invention but, of course, should not be construed as in any way limiting its scope.

The following examples demonstrate how various collectors and combinations of collectors (one collector comprising a membrane coated with porous silica, one collector comprising a membrane coated with a hydrophobic zeolite coating (Z300; Zeochem LLC, Louisville, Ky.) and one collector comprising a membrane coated with another hydrophobic zeolite coating (Z110; Zeochem LLC, Louisville, Ky.) can be used to identify, and distinguish between, contaminants, wherein "response spectra" and "response features" can be defined and used by a pattern recognition algorithm to identify the contaminants.

In these Examples, an aircraft air contaminant analyzer is set up as generally shown in FIG. 1B with two collectors and a pair of identical gravimetric sensors under each collector, each gravimetric sensor including a resonator and balance capacitor set up as generally shown in FIG. 2.

The gravimetric sensors are each micromachined (MEMS) piezoelectric bimorph SiC—AlN resonator arrays with a wide mass-loading dynamic range and linear mass-loading response. The resonators each have a small tethered plate that provide resonance modes with high mass-loading sensitivities, and includes thin film electrodes deposited onto the surface to electrically drive it to resonance and to transduce the motion back into an electrical signal for readout. The sensors include metal traces to bring the signals to and from the resonator. The resonant frequencies are in the range of ~1 MHz to 30 MHz.

The balance capacitors are identical to the gravimetric sensors, but arranged to be incapable of motion.

Each collector includes a coated microporous silicon membrane (one membrane having a porous silica coating, the other two having different hydrophobic zeolite coatings as described above) the membrane having about 25 micrometer diameter flow-through channels, wherein the coating is on the upstream, downstream, and flow-through channel surfaces.

The heaters are tantalum-platinum (TaPt) high temperature compatible thin film resistive heaters, fabricated into the substrates and deposited directly on the membranes using processes known in the art, e.g., with a combination of deposition, lithography, and dissolution, processes.

Example 1

In this Example, one pair of gravimetric sensors measures the desorption from a collector comprising a membrane coated with porous silica, and the other pair of sensors measures the desorption from a collector comprising a membrane coated with a hydrophobic zeolite coating (Z300; Zeochem LLC, Louisville, Ky.).

Figure 4:
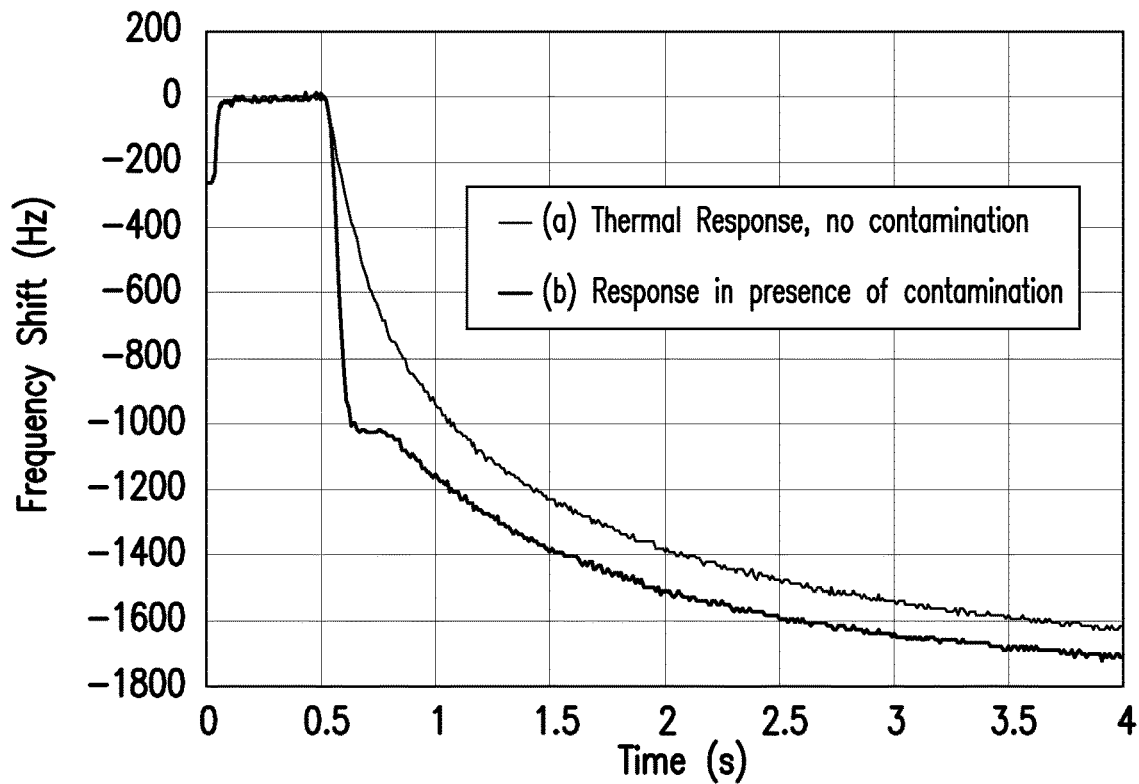
FIG. 4 shows determining the response spectra for deicing fluid using an embodiment of an aircraft air contaminant analyzer according to the invention.

The frequency shift versus time is first determined in the absence of contaminants (for example, using clean laboratory air during calibration or air passing through a sterilizing filter or without first passing air through the collector). For example, the resonance frequency is measured every 0.01 seconds for 4 seconds. Resonance frequency decreases starting at 0.5 s when heating power is applied to the collector. Heat transferred to the resonator decreases its resonant frequency. This is also called the "thermal response," and illustrates the response spectra in the absence of contaminants. The response spectra is also determined in the presence of the contaminant (deicing fluid), and both response spectra are shown in FIG. 4.

The first response spectra (without a contaminant) is subtracted from the second response spectra (with the contaminant), revealing the frequency shift caused by presence of the contaminant only, illustrating the "thermal subtracted response," as shown in FIG. 5.

Various features can be calculated from the "thermal subtracted responses." Four examples of such features are:
a) Maximum frequency shift (MFS): the maximum frequency shift seen during the response.
b) Sum before peak (SB): the area under the curve before the MFS.
c) Sum after peak (SA): the area under the curve after the MFS.
d) Segment #5 (S5): the average of the $37^{th}$ thru $46^{th}$ frequency measurements following the MFS.

Figure 6:
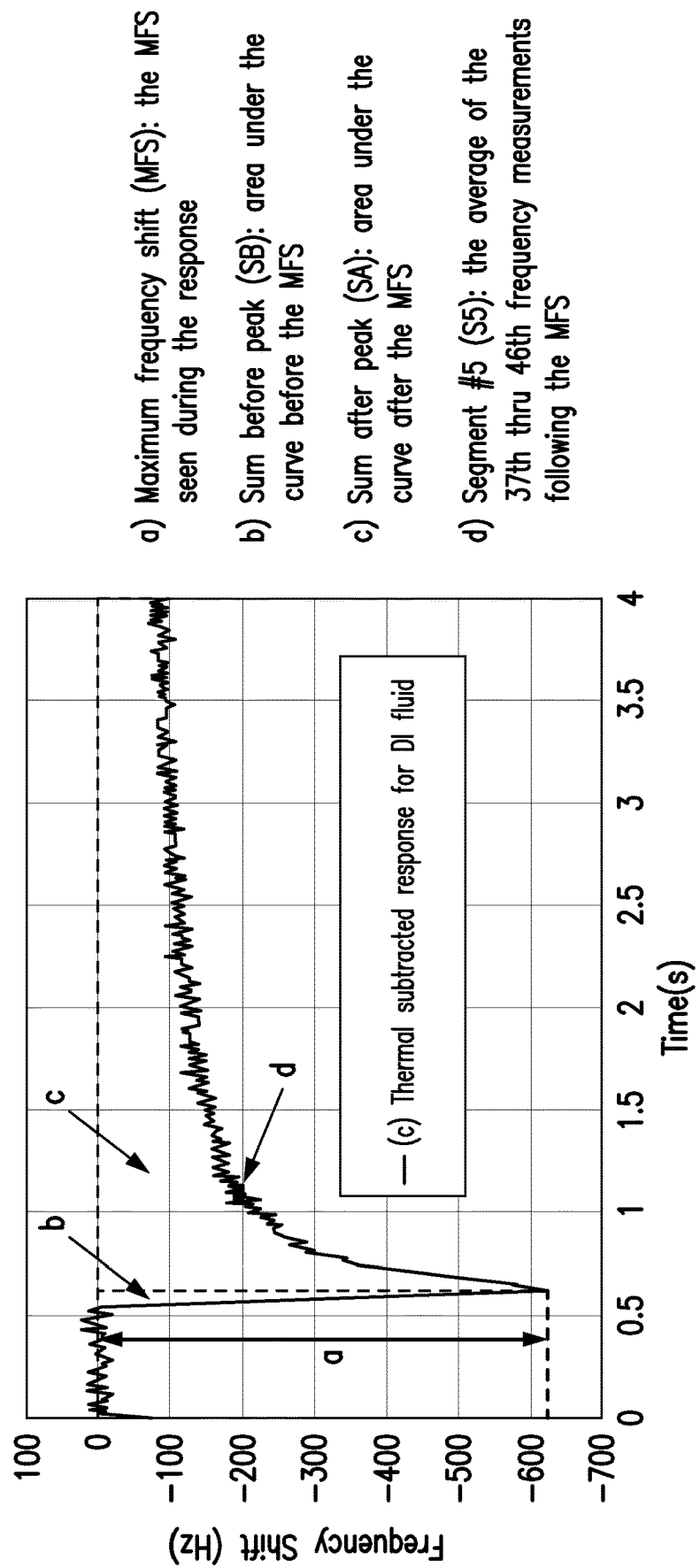
FIG. 6 shows four features that are calculated from the thermal subtracted responses: a) Maximum frequency shift (MFS); b) Sum before peak (SB); c) Sum after peak (SA); and d) Segment #5 (S5).

These four features are shown in FIG. 6.

Example 2

This example demonstrates how the feature MFS as described in Example 1 can be used by a pattern recognition algorithm to identify the contaminants.

Using an aircraft air contaminant analyzer with gravimetric sensors as described in Example 1, the frequency shift versus time is determined when the analyzer is sequentially challenged with turbine engine oil (AEROSHELL 560; Shell), hydraulic fluid (Exxon HYJET; Exxon), and deicing fluid.

Figure 7:
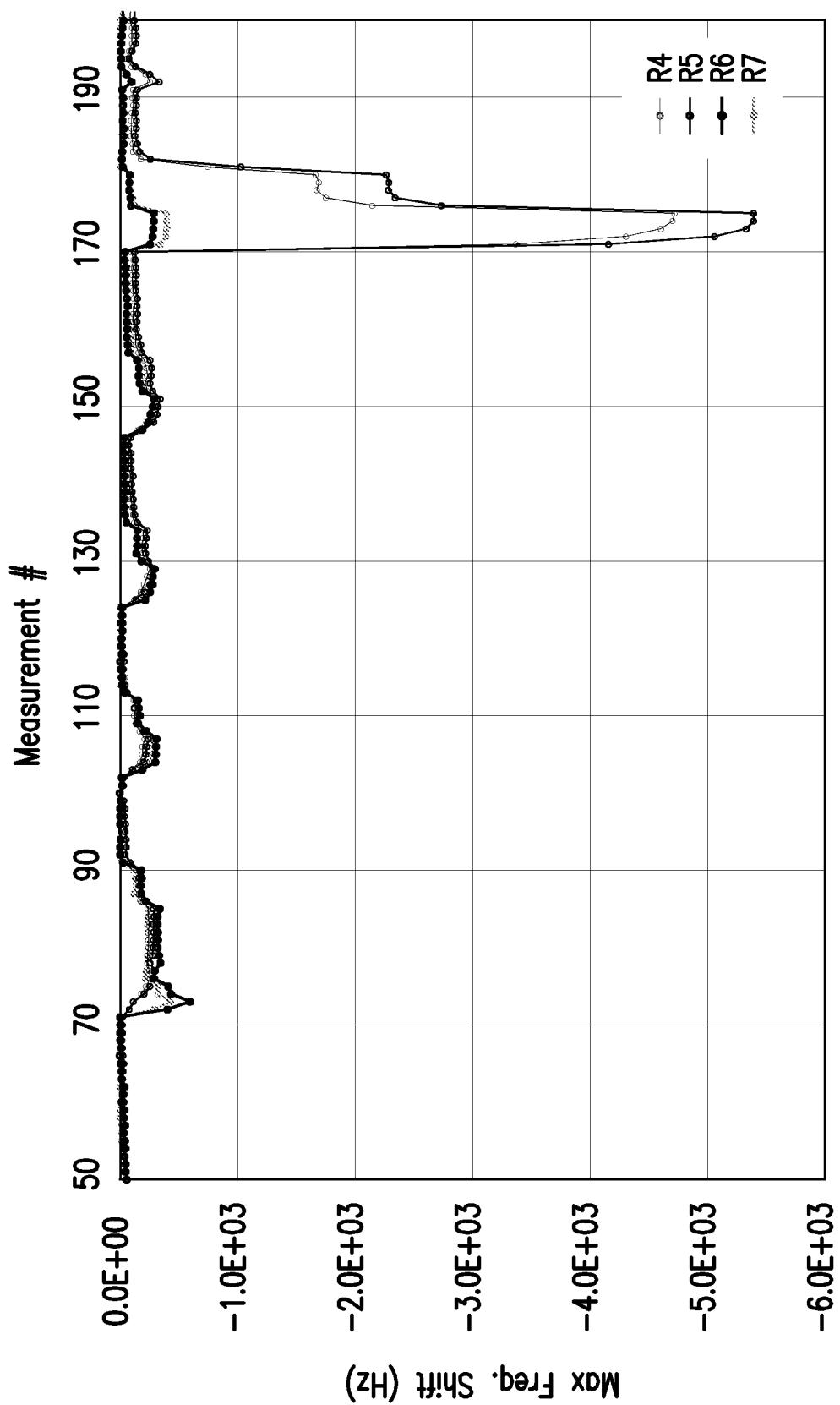
FIGS. 7 and 8 show using the feature MFS of two aircraft air contaminant collectors with different chemoselective coatings to distinguish between contaminants.

The results are shown in FIG. 7, wherein the responses (average MFSs) are similar for oil and hydraulic fluid, and different for deicing fluid.

Figure 8:
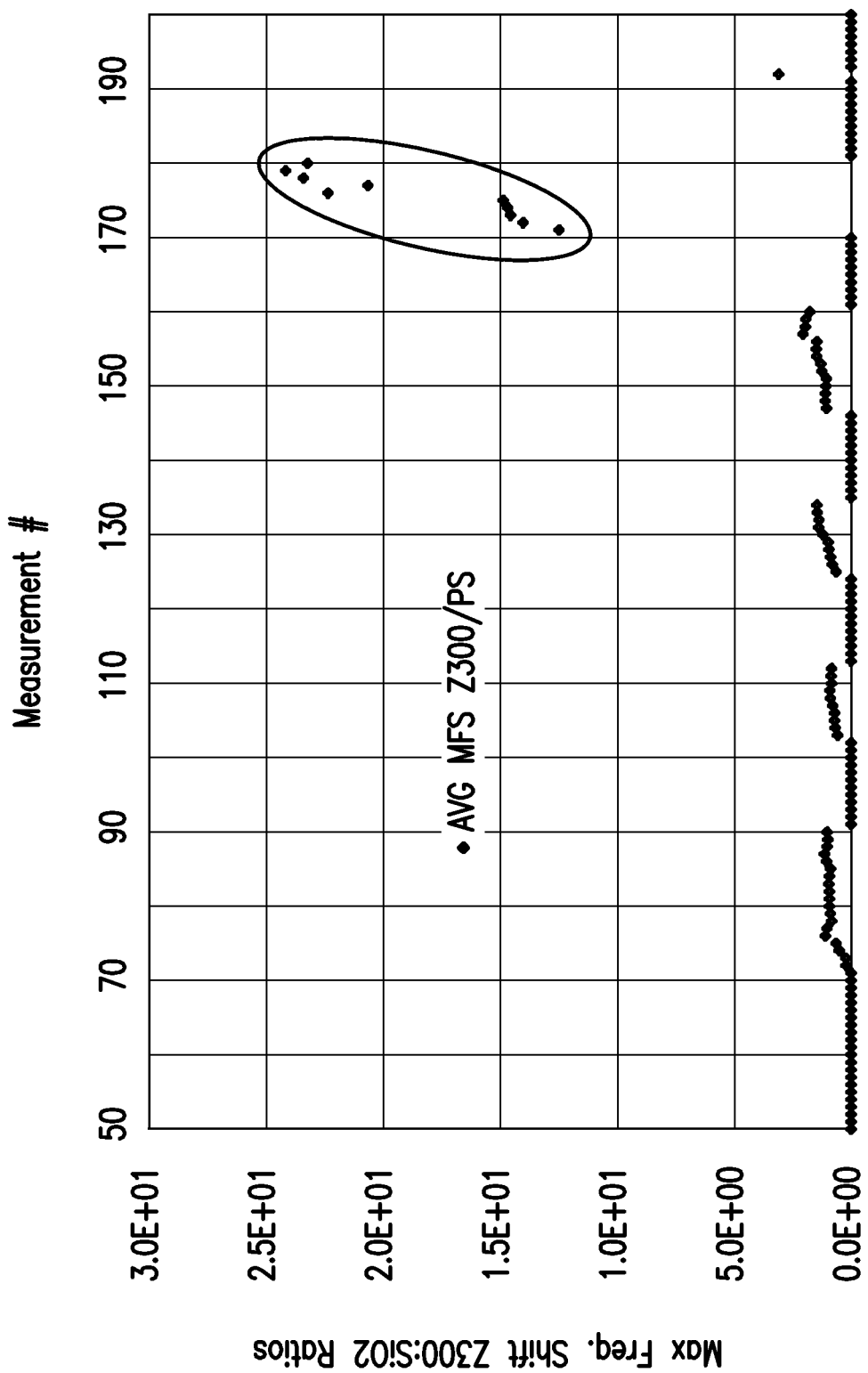

As shown in FIG. 8, the use of the feature MFS shows deicing fluid can be distinguished from hydraulic fluid and turbine engine oil: for hydraulic fluid and turbine engine oil, the ratio of the MFS feature from the gravimetric sensor next to the porous silica coated collector to the MFS feature from the gravimetric sensor next to the Z300 coated collector ranges between 0 and about 2, whereas for deicing fluid the ratio ranges between about 12 and about 23.

Example 3

This example demonstrates how the feature SB/SA as described in Example 1 can be used by a pattern recognition algorithm to identify the contaminants.

Using an aircraft air contaminant analyzer with gravimetric sensors as described in Example 1, the frequency shift versus time is determined when the analyzer is sequentially challenged with turbine engine oil (AEROSHELL 560; Shell), hydraulic fluid (Exxon HYJET; Exxon), and deicing fluid.

Figure 9A:
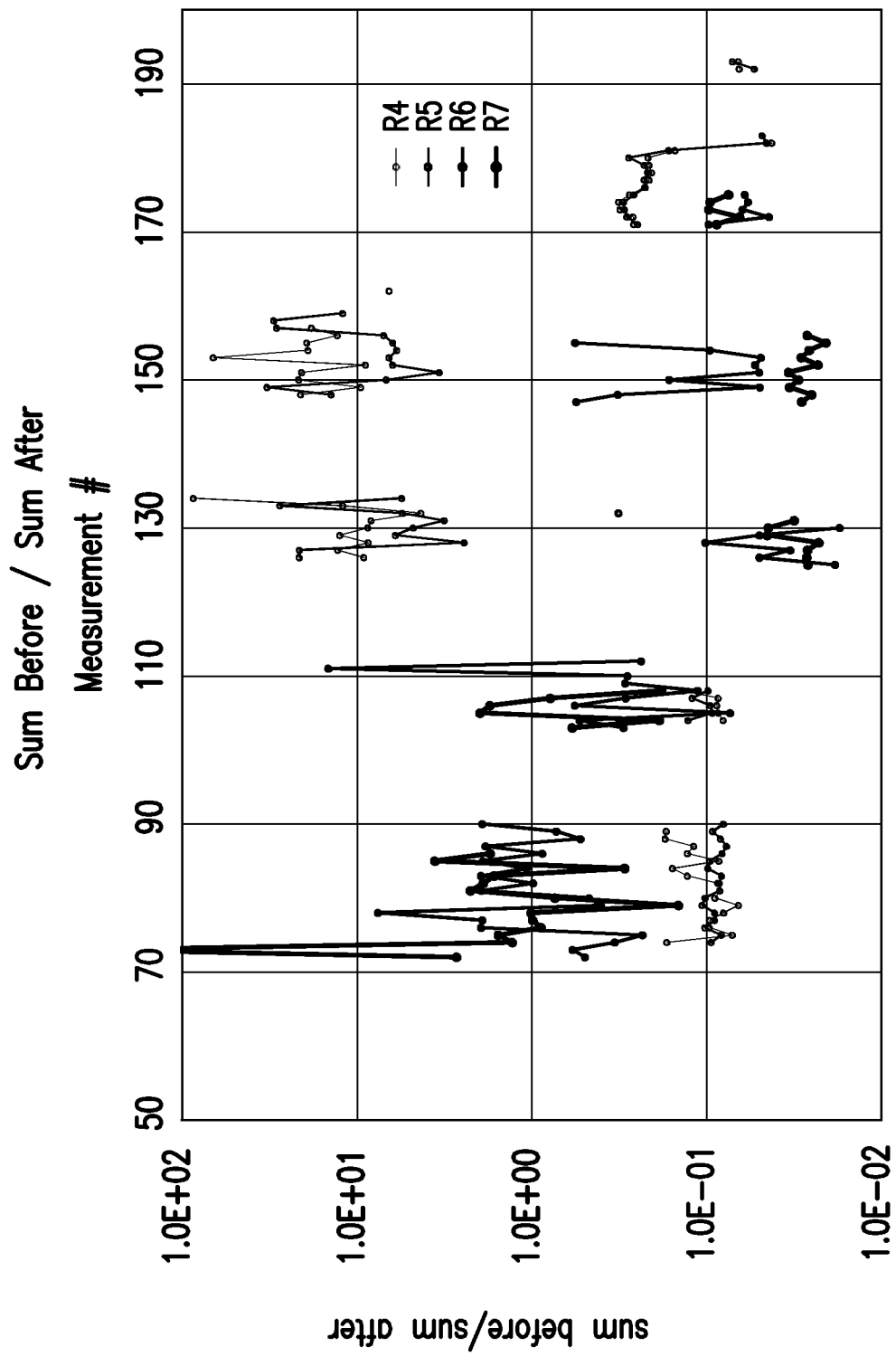
FIGS. 9A and 9B show using the ratio of SB/SA of two aircraft air contaminant collectors with different chemoselective coatings to distinguish between contaminants.
Figure 9B:
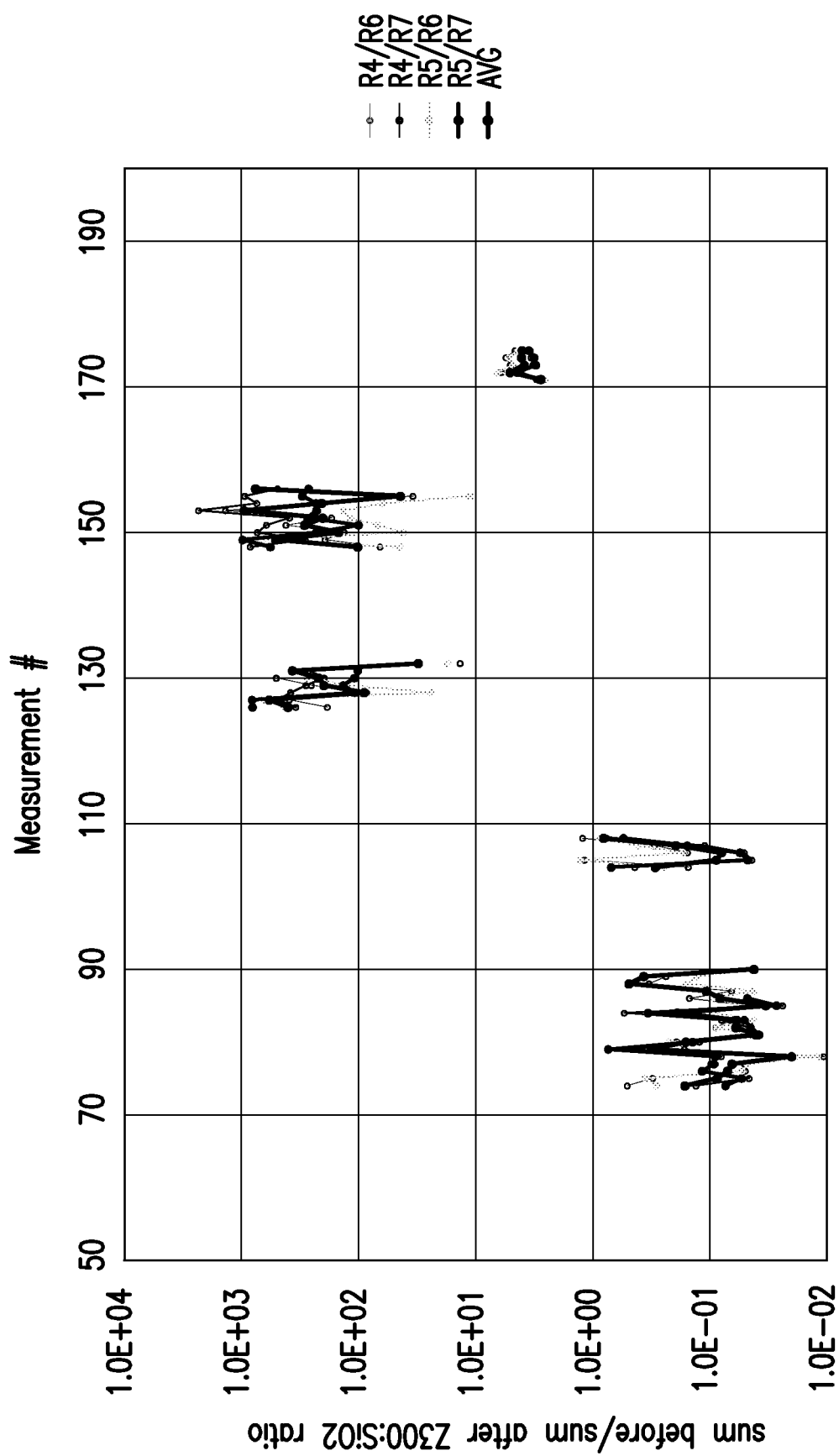

As shown in FIGS. 9A and 9B (9B showing the average of the ratios), the use of the feature SB/SA shows that the ratio is high for hydraulic fluid, near the middle for deicing fluid, and low for turbine engine oil.

Example 4

This example demonstrates how the feature S5 as described in Example 1 can be used by a pattern recognition algorithm to identify the contaminants.

Using an aircraft air contaminant analyzer with 2 pairs gravimetric sensors, wherein one pair of gravimetric sensors measures the desorption from a collector comprising a membrane coated with a hydrophobic zeolite coating Z300 (Zeochem LLC, Louisville, Ky.), and the other pair of gravimetric sensors measures the desorption from a collector comprising a membrane with a more hydrophobic zeolite coating Z110 (Zeochem LLC, Louisville, Ky.)), the frequency shift versus time is determined for turbine engine oil (AEROSHELL 560; Shell), and hydraulic fluid.

Figure 10:
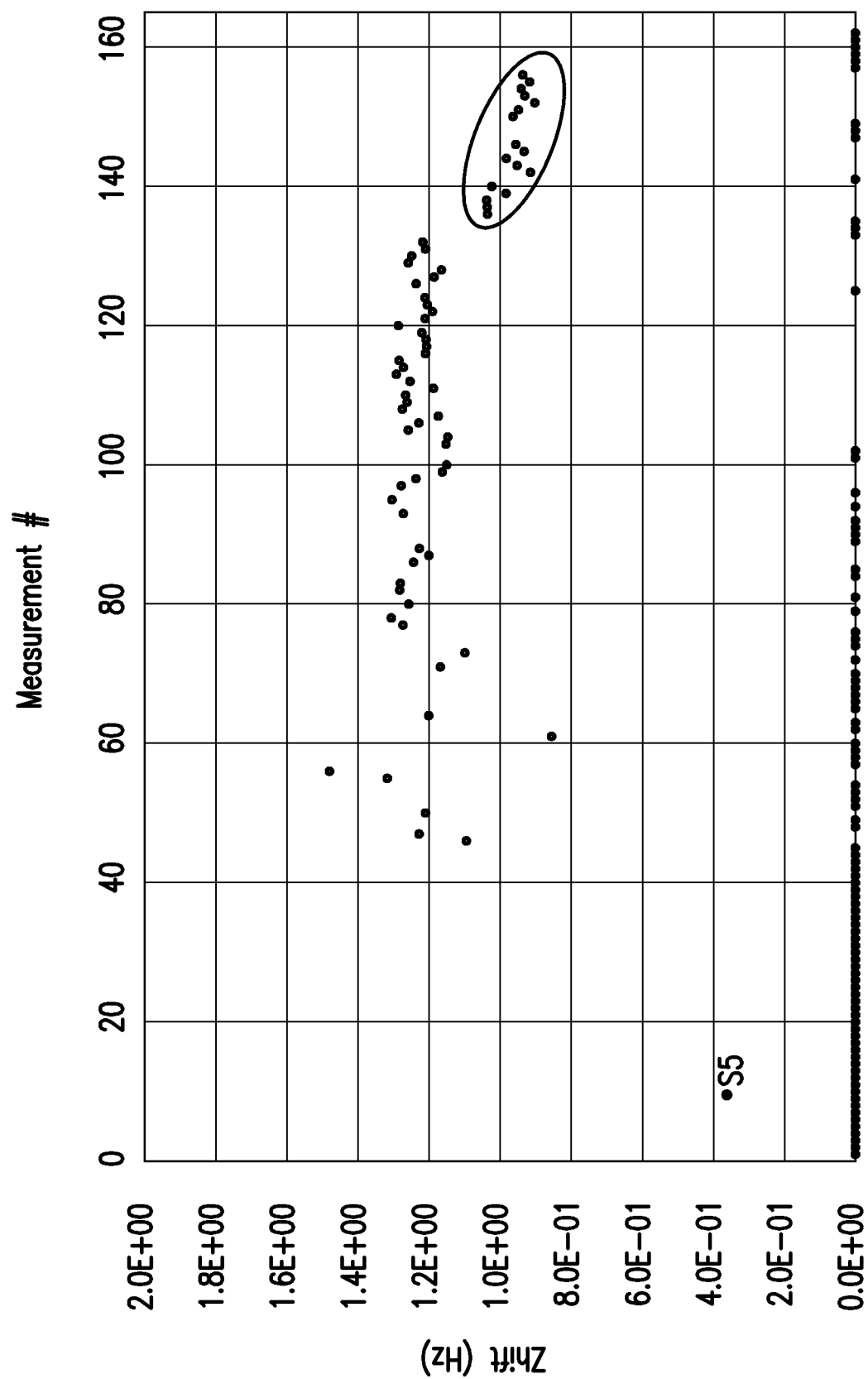
FIG. 10 shows using the feature S5 of two aircraft air contaminant collectors with different chemoselective coatings to distinguish between contaminants.

As shown in FIG. 10, the use of the feature S5 shows that the feature helps distinguish hydraulic fluid (values above about 1.2) from turbine engine oil, wherein the hydraulic fluid is the low (circled, values in the range of about 0.9 to about 1.05) data.

Example 5

This example demonstrates how the feature MFS as described in Example 1 can be used by a pattern recognition algorithm to identify the contaminants.

Using an aircraft air contaminant analyzer with 2 gravimetric sensors, wherein one gravimetric sensor measures the desorption from a collector comprising a membrane coated with a hydrophilic zeolite coating Z810 (Zeochem LLC, Louisville, Ky.), and the other gravimetric sensor measures the desorption from a collector comprising a membrane with a hydrophobic zeolite coating Z110 (Zeochem LLC, Louisville, Ky.)), the frequency shift versus time is determined for turbine engine oil (AEROSHELL 560; Shell), and hydraulic fluid.

Figure 11A:
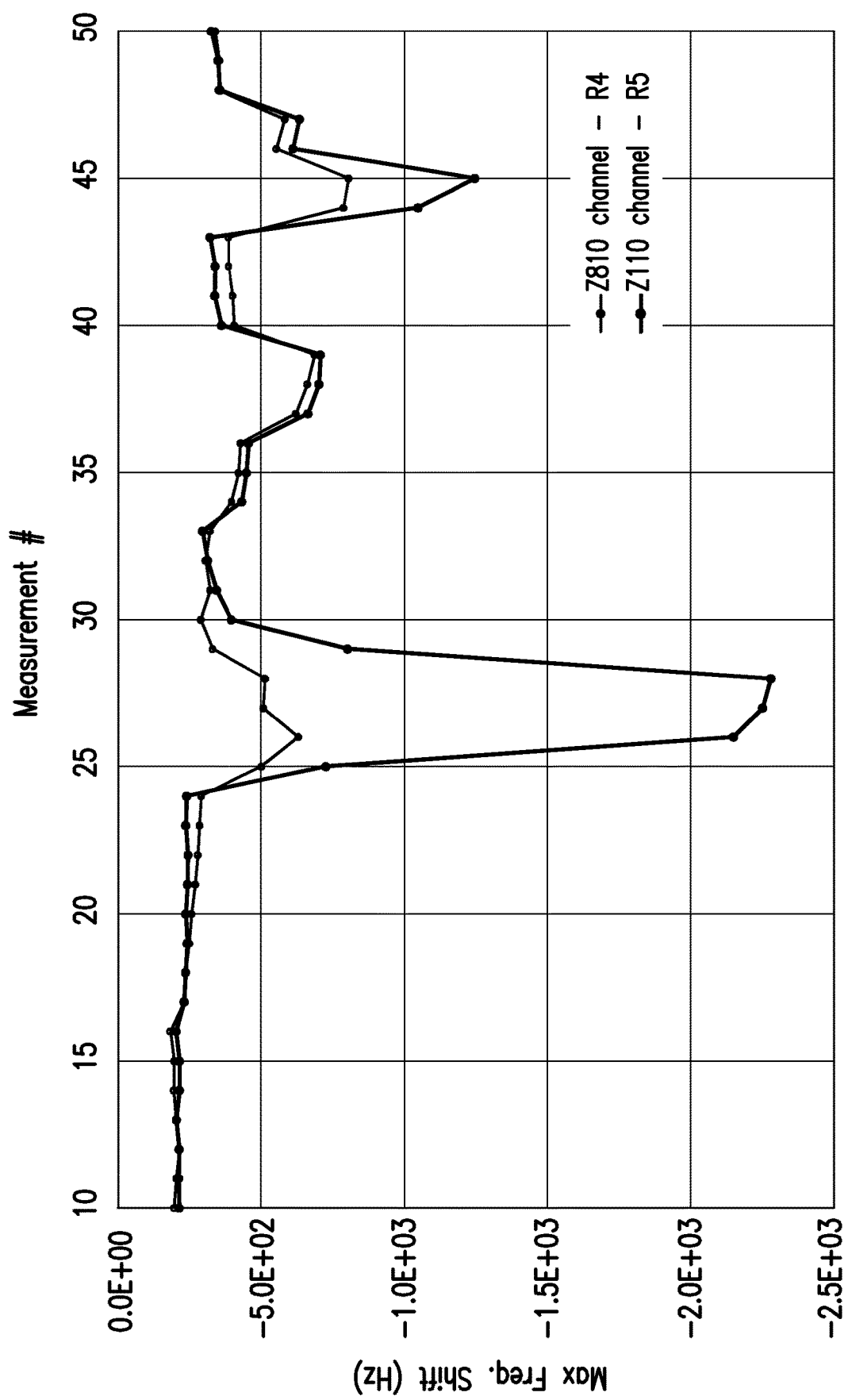
FIGS. 11A and 11B show using the MFS feature of two aircraft air contaminant collectors with different chemoselective coatings to distinguish between contaminants.
Figure 11B:
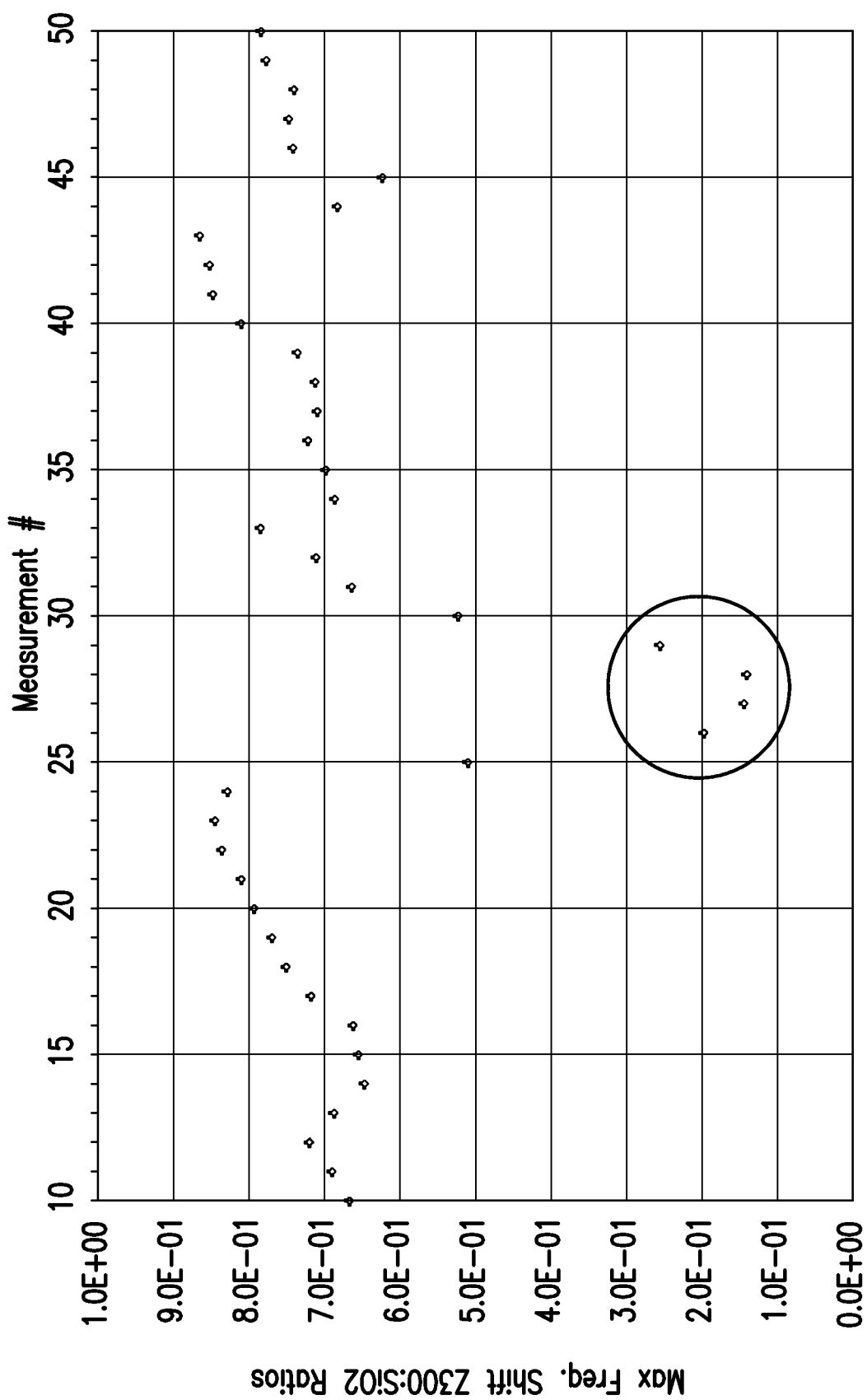

As shown in FIGS. 11A and 11B, the use of MFS helps distinguish deicing fluid from turbine engine oil and hydraulic fluid. In FIG. 11B, the deicing fluid is the low (circled, values about 0.2) data, and the values for the turbine engine oil and hydraulic fluid are in the range of from about 0.65 to about 0.85).

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method for determining and classifying by type aircraft air contaminants, the method comprising:
   (a) passing aircraft air through an aircraft air contaminant analyzer comprising at least one aircraft air contaminant collector comprising:
      (i) a microporous medium comprising microporous flow-through channels, the microporous medium having a chemoselective coating; and,
      (ii) a thin film resistive heater, capable of heating to a temperature that vaporizes captured air contaminants, wherein the heater is in contact with the microporous medium;
   (b) capturing air contaminants by the microporous medium;
   (c) discontinuing passing aircraft air through the at least one aircraft air contaminant collector;
   (d) heating the microporous medium to a temperature sufficient to vaporize the captured air contaminants and desorb the captured air contaminants;
   (e) receiving the desorbed air contaminants on a gravimetric sensor arranged to generate a proportionate resonant frequency response when air contaminant mass is added to or removed from the gravimetric sensor;
   (f) measuring the proportionate resonant frequency response generated by the gravimetric sensor as the air contaminant is added to and removed from the gravimetric sensor;
   (g) executing an air contaminant recognition program stored upon a computer-readable medium, including calculating air contaminant concentration and determining air contaminant type; and,
   (h) outputting the determined air contaminant concentration and air contaminant type.

2. The method of claim 1, wherein the air contaminants comprise aerosols.

3. The method of claim 1, wherein (f) comprises achieving at least about a 4:1 signal-to-noise ratio.

4. The method of claim 1, further comprising self-zeroing the gravimetric sensor referencing the proportionate resonant frequency response in (e) and (f) just prior to heating the microporous medium in (d) before passing additional aircraft air through the aircraft air contaminant collector.

5. The method of claim 1, wherein (f) comprises measuring the proportionate resonant frequency response at a rate of about 10 to about 100 measurements per second for about 1 second to about 4 seconds.

6. The method of claim 1, wherein (a) comprises passing aircraft air through the air contaminant collector at a controlled flow rate of about 500 to about 2000 standard cubic centimeter per minute for about 10 seconds to about 60 seconds.

7. The method of claim 1, wherein (a)-(c), (e), and (f) are carried out at a fixed temperature in the range of about 30° C. to about 70° C.

8. The method of claim 1, comprising discontinuing passing aircraft air through the aircraft air contaminant collector in (c) for at least about 0.2 seconds before heating the microporous medium in (d).

9. The method of claim 1, wherein (h) comprises displaying the determined air contaminant type on a screen of a display device.

10. The method of claim 9, wherein the display device is a hand-held device.

11. The method of claim 9, wherein the display device comprises a indicator and (h) comprises displaying the determined air contaminant type by illuminating the indicator.

12. The method of claim 11, wherein the gravimetric sensor is arranged in an aircraft cabin or cockpit.

13. The method of claim 1, wherein the gravimetric sensor is selected from a thin film resonator (TFR), a surface acoustic wave (SAW) resonator, a thickness sheer mode (TSM) resonator (quartz crystal microbalance (QCM) resonator), an acoustic plate mode (APM) resonator, a flexural plate wave (FPW) resonator, a bulk acoustic wave (BAW) resonator, a piezoelectric bimorph resonator array sensor, and a tuning fork sensor.

14. The method of claim 13, wherein the gravimetric sensor comprises a piezoelectric bimorph resonator array comprising two active layers, the layers bending when air contaminant mass is added to or removed from at least one of the layers, the resonator array generating a proportionate resonant frequency response upon bending of the layers, for classifying air contaminant type.

15. The method of claim 1, wherein (h) comprises displaying the determined air contaminant type using a display device.

16. The method of claim 1, wherein the aircraft air contaminant analyzer comprises two or more aircraft air contaminant collectors, each aircraft air contaminant collector separately comprising:
(i) a microporous medium comprising microporous flow-through channels, the microporous medium having a chemoselective coating; and,
(ii) a thin film resistive heater, capable of heating to a temperature that vaporizes captured air contaminants, wherein the heater is in contact with the microporous medium;
the aircraft air contaminant analyzer further comprising a gravimetric sensor near each collector; and
the method comprises passing aircraft air through the aircraft air contaminant analyzers such that separate portions of aircraft air pass through each of the two or more aircraft air contaminant collectors; and
carrying out (b)-(h) with respect to each of the two or more aircraft air contaminant collectors such that the determined air contaminant concentration and air contaminant type is outputted with respect to each of the two or more aircraft air contaminant collectors.

17. An aircraft air contaminant analyzer comprising:
(a) at least one aircraft air contaminant collector comprising:
(i) a microporous medium comprising microporous flow-through channels and a chemoselective coating, wherein the microporous medium remains functional and desorbs captured air contaminants while being heated for a controlled time period;
(ii) a thin film resistive heater, capable of heating to a temperature that vaporizes captured air contaminants, wherein the heater is in contact with the microporous medium;
(b) a first substrate, having a top surface and a bottom surface; wherein the contaminant collector is associated with the first substrate, the microporous medium and heater being thermally insulated from the first substrate;
(c) a gravimetric sensor arranged to generate a proportionate resonant frequency response when air contaminant mass is added to or removed from the gravimetric sensor, for classifying air contaminant type;
(d) a second substrate, having a top surface and a bottom surface; wherein the gravimetric sensor is associated with the top surface of the second substrate, the gravimetric sensor being separated from the contaminant collector by a constant distance, the gravimetric sensor being arranged to receive air contaminants desorbed from the microporous medium when the microporous medium is heated;
(e) a support comprising a top surface and a bottom surface, the support comprising at least one aircraft air inlet port passing through the top surface and the bottom surface of the support, wherein the bottom surface of the second substrate is associated with the top surface of the support;
(f) a resonant frequency measurement device, arranged to measure the proportionate resonant frequency response generated by the gravimetric sensor as the air contaminant is added to and removed from the gravimetric sensor;
(g) a computer readable medium bearing an air contaminant recognition program and calibration data;
(h) a processor configured to execute the air contaminant recognition program, the contaminant recognition program including a module configured to classify the air contaminant by type, and a module programmed to use the calibration data for comparison with magnitude of the proportionate resonant frequency response generated by the gravimetric sensor to calculate air contaminant concentration; and,
(i) a pump, arranged to generate flow of aircraft air through the at least one aircraft air inlet port and through the at least one air contaminant collector before and after the microporous medium is heated.

18. The aircraft air contaminant analyzer of claim 17, wherein the aircraft air contaminant collector is tethered to the first substrate.

19. The aircraft air contaminant analyzer of claim 17, wherein the heater is integrated with the microporous medium.

20. The aircraft air contaminant analyzer of claim 17, wherein the gravimetric sensor is selected from a thin film resonator (TFR), a surface acoustic wave (SAW) resonator, a thickness sheer mode (TSM) resonator (quartz crystal microbalance (QCM) resonator), an acoustic plate mode (APM) resonator, a flexural plate wave (FPW) resonator, a bulk acoustic wave (BAW) resonator, a piezoelectric bimorph resonator array resonator, and a tuning fork resonator.

21. The aircraft air contaminant analyzer of claim 20, wherein the gravimetric sensor comprises a piezoelectric bimorph resonator array comprising two active layers, the layers bending under resonance, the resonator array generating a proportionate change in resonant frequency upon the addition or removal of air contaminant mass.

22. The aircraft air contaminant analyzer of claim 17, wherein the aircraft air contaminant analyzer comprises at least one additional aircraft air contaminant collector comprising:
- (i') a microporous medium comprising microporous flow-through channels and a chemoselective coating, wherein the microporous medium remains functional and desorbs captured air contaminants while being heated for a controlled time period;
- (ii') a thin film resistive heater, capable of heating to a temperature that vaporizes captured air contaminants, wherein the heater is in contact with the microporous medium;
- (b') an additional first substrate, having a top surface and a bottom surface;
- wherein the additional contaminant collector is associated with the additional first substrate, the microporous medium and heater being thermally insulated from the additional first substrate;
- (c') an additional gravimetric sensor arranged to generate a proportionate resonant frequency response when air contaminant mass is added to or removed from the gravimetric sensor, for classifying air contaminant type;
- (d') an additional second substrate, having a top surface and a bottom surface; wherein the additional gravimetric sensor is associated with the top surface of the additional second substrate, the additional gravimetric sensor being separated from the additional contaminant collector by a constant distance, the additional gravimetric sensor being arranged to receive air contaminants desorbed from the microporous medium when the microporous medium is heated, wherein the bottom surface of the additional second substrate is associated with the top surface of the support;
- wherein the resonant frequency measurement device is arranged to measure the proportionate resonant frequency response generated by the additional gravimetric sensor as the air contaminant is added to and removed from the additional gravimetric sensor;
- wherein the contaminant recognition program module is configured to classify the air contaminants by type, and the module is programmed to use the calibration data for comparison with magnitude of the proportionate resonant frequency response generated by the additional gravimetric sensor to calculate air contaminant concentrations; and,
- the pump is arranged to generate flow of aircraft air through the at least one aircraft air inlet port and also through the at least one additional air contaminant collector before and after the respective microporous medium is heated.

* * * * *